United States Patent
Lai et al.

(10) Patent No.: US 8,399,891 B2
(45) Date of Patent: Mar. 19, 2013

(54) ACTIVE DEVICE ARRAY SUBSTRATE AND METHOD FOR FABRICATING THE SAME

(75) Inventors: Po-Lin Lai, Changhua County (TW); Ying-Fa Huang, Kaohsiung (JP); Chun-Ming Yang, Taichung (TW); Wen-Bin Wu, Taoyuan County (TW); Wen-Yi Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 252 days.

(21) Appl. No.: 12/943,933

(22) Filed: Nov. 11, 2010

(65) Prior Publication Data
US 2012/0043558 A1    Feb. 23, 2012

(30) Foreign Application Priority Data
Aug. 18, 2010   (TW) ................................ 99127601 A

(51) Int. Cl.
*H01L 29/72* (2006.01)
(52) U.S. Cl. .................... 257/88; 257/99; 257/E21.521; 257/E27.12
(58) Field of Classification Search .................... 257/88, 257/99, E21.521, E27.12
See application file for complete search history.

(56) References Cited

U.S. PATENT DOCUMENTS
| | | |
|---|---|---|
| 5,715,025 A | 2/1998 | Ogurtsov et al. |
| 2007/0090856 A1 | 4/2007 | Liao et al. |
| 2011/0233567 A1* | 9/2011 | Li et al. .......................... 257/88 |

FOREIGN PATENT DOCUMENTS
TW    200717078    5/2007

* cited by examiner

*Primary Examiner* — Edward Wojciechowicz
(74) *Attorney, Agent, or Firm* — Jianq Chyun IP Office

(57) ABSTRACT

An active device array substrate and a fabricating method thereof are provided. A first patterned conductive layer including separated scan line patterns is formed on a substrate. Each scan line pattern includes a first and second scan lines adjacent to each other. Both the first and the second scan lines have first and second contacts. An open inspection on the scan line patterns is performed. Channel layers are formed on the substrate. A second patterned conductive layer including data lines interlaced with the first and second scan lines, sources and drains located above the channel layers, and connectors is formed on the substrate. The sources electrically connect the data lines correspondingly. At least one of the connectors electrically connects the first and second scan lines, so as to form a loop in each scan line pattern. Pixel electrodes electrically connected to the drains are formed.

10 Claims, 24 Drawing Sheets

ACTIVE DEVICE ARRAY SUBSTRATE AND METHOD FOR FABRICATING THE SAME

CROSS-REFERENCE TO RELATED APPLICATION

This application claims the priority benefit of Taiwan application serial no. 99127601, filed on Aug. 18, 2010. The entirety of the above-mentioned patent application is hereby incorporated by reference herein and made a part of this specification.

BACKGROUND OF THE INVENTION

1. Field of the Invention

The present invention relates to an array substrate and a method for fabricating the same, and in particular, to an active device array substrate and a method for fabricating the same.

2. Description of Related Art

The increasing progress of display technologies brings about great conveniences to people's daily lives. As such, flat panel displays (FPDs) featuring compactness have been prevailing. Among various types of FPDs, liquid crystal displays (LCD) have superb characteristics, such as high space utilization efficiency, low power consumption, no radiation, and low electromagnetic interference, so that LCDs have become popular among consumers.

In general, an LCD panel is mainly comprised of an active device array substrate, an opposite substrate, and a liquid crystal layer sandwiched between the active device array substrate and the opposite substrate. The active device array substrate has a display region and a non-display region. A plurality of pixel units arranged in an array are disposed in the display region, and each of the pixel units includes an active device and a pixel electrode connected to the active device. In addition, a plurality of scan lines and a plurality of data lines are disposed in the display region, and the active device in each of the pixel units is electrically connected to the corresponding scan line and the corresponding data line.

Even though the technology tends to be mature, defects inevitably occur during the fabrication of the active device array substrate. For instance, the significant total length of the scan lines on the active device array substrate easily results in broken lines, such that some pixel units cannot be operated. Therefore, inspection on the scan lines needs to be performed to determine whether the broken lines exist. However, when the gate is designed to have the dual-scan-line arrangement, the two scan lines in each set of dual scan line patterns are connected to each other and form a loop. Given one of the scan lines is broken, the test signals can still be transmitted through the other scan line in the loop. As such, whether any of the scan lines in the loop is broken or not cannot be effectively determined by means of an inspection machine. Consequently the defect detection rate of the inspection machine is incredibly low when the active device array substrate is inspected, and reliability of the product is deteriorated.

SUMMARY OF THE INVENTION

In view of the above, the present invention is directed to an active device array substrate and a method for fabricating the same.

The present invention provides a method for fabricating an active device array substrate, and the method includes following steps. Form a first patterned conductive layer on a substrate. The first patterned conductive layer includes a plurality of scan line patterns separated from one another. Each of the scan line patterns includes a first scan line and a second scan line disposed adjacent to the first scan line. The first scan line has a first contact and a second contact, and the second scan line has a first contact and a second contact as well. Perform an open inspection on the scan line patterns. Form a plurality of channel layers on the substrate. Form a second patterned conductive layer on the substrate. The second patterned conductive layer includes a plurality of data lines interlaced with the first and the second scan lines, a plurality of sources and drains located above the channel layers, and a plurality of connectors. The sources are electrically connected to the data lines correspondingly. At least one of the connectors electrically connects the first scan line and the second scan line in each of the scan line patterns, so as to form a loop. Form a plurality of pixel electrodes electrically connected to the drains.

The present invention further provides a method for fabricating an active device array substrate, and the method includes following steps. From a first patterned conductive layer on a substrate. The first patterned conductive layer includes a plurality of scan line patterns separated from one another. Each of the scan line patterns includes a first scan line and at least one second scan line disposed adjacent to the first scan line. The first scan line has a first contact and a second contact, and the at least one second scan line has a first contact and a second contact as well. Perform an open inspection on the scan line patterns. Form a plurality of channel layers on the substrate. Form a second patterned conductive layer on the substrate. The second patterned conductive layer includes a plurality of data lines interlaced with the first and the second scan lines, a plurality of sources and drains located above the channel layers, and a plurality of first connectors. The sources are electrically connected to the data lines correspondingly. Form a third patterned conductive layer. The third patterned conductive layer includes a plurality of second connectors and a plurality of pixel electrodes. The pixel electrodes are connected to the drains. The second scan lines are electrically connected to the corresponding first scan lines through the first connectors and the second connectors, so as form a loop.

The present invention further provides an active device array substrate that includes a substrate, a first patterned conductive layer, a plurality of channel layers, a second patterned conductive layer, and a plurality of pixel electrodes. The first patterned conductive layer is formed on the substrate, and the first patterned conductive layer includes a plurality of scan line patterns separated from one another. Each of the scan line patterns includes a first scan line and a second scan line. The first scan line has a first contact and a second contact, and the second scan line has a first contact and a second contact as well. The channel layers are disposed on the substrate. The second patterned conductive layer is disposed on the substrate. Here, the second patterned conductive layer includes a plurality of data lines interlaced with the first scan lines and the second scan lines, a plurality of sources and drains located above the channel layers, and a plurality of connectors. The sources are electrically connected to the data lines correspondingly. At least one of the connectors electrically connects the first scan line and the second scan line in each of the scan line patterns, so as to form a loop. The pixel electrodes are connected to the drains.

The present invention further provides an active device array substrate that includes a substrate, a first patterned conductive layer, a plurality of channel layers, a second patterned conductive layer, and a third patterned conductive layer. The first patterned conductive layer is formed on the substrate, and the first patterned conductive layer includes a plurality of scan line patterns separated from one another. Each of the scan line patterns includes a first scan line and a second scan line. The first scan line has a first contact and a second contact, and the second scan line has a first contact and a second contact as well. The channel layers and the second patterned conductive layer are disposed on the substrate. The second patterned conductive layer includes a plurality of data lines interlaced with the first scan lines and the second scan lines, a plurality of sources connected to the first scan lines and the second scan lines, a plurality of drains, and a plurality of first connectors. The third patterned conductive layer includes a plurality of second connectors and a plurality of pixel electrodes. The pixel electrodes are connected to the drains. The first connectors and the second connectors connect the first contacts of the second scan lines and the first contacts of the corresponding first scan lines.

Based on the above, the scan line patterns do not form the loop in the present invention, and the open inspection on the first scan lines and the second scan lines is respectively performed, so as to easily determine whether the broken line effects exist and improve the open inspection rate. In addition, after the open inspection, the first scan lines and the second scan lines are electrically connected through the connectors, so as to form the loop. Hence, the method of the present invention is compatible with the existing manufacturing process.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 1A to FIG. 5A are schematic top views showing a fabricating process of an active device array substrate according to a first embodiment of the present invention.

FIG. 1B to FIG. 5B are schematic cross-sectional views taken along a line segment I-I' depicted in FIG. 1A to FIG. 5A, respectively.

FIG. 7A to FIG. 10A are schematic top views showing a fabricating process of an active device array substrate according to a second embodiment of the present invention.

FIG. 7B to FIG. 10B are schematic cross-sectional views taken along a line segment III-III' depicted in FIG. 7A to FIG. 10A, respectively.

DESCRIPTION OF EMBODIMENTS

Top views and cross-sectional views are provided herein to elaborate an active device array substrate and a method for fabricating the same in the following embodiments of the present invention. FIG. 1A to FIG. 5A are schematic top views showing a fabricating process of an active device array substrate according to a first embodiment of the present invention. FIG. 1B to FIG. 5B are schematic cross-sectional views taken along a line segment I-I' depicted in FIG. 1A to FIG. 5A, respectively. FIG. 1C is a schematic top view of performing an open inspection according to an embodiment of the present invention. FIG. 3C is a schematic cross-sectional view taken along a line segment II-IF depicted in FIG. 3A.

Figure 1A:
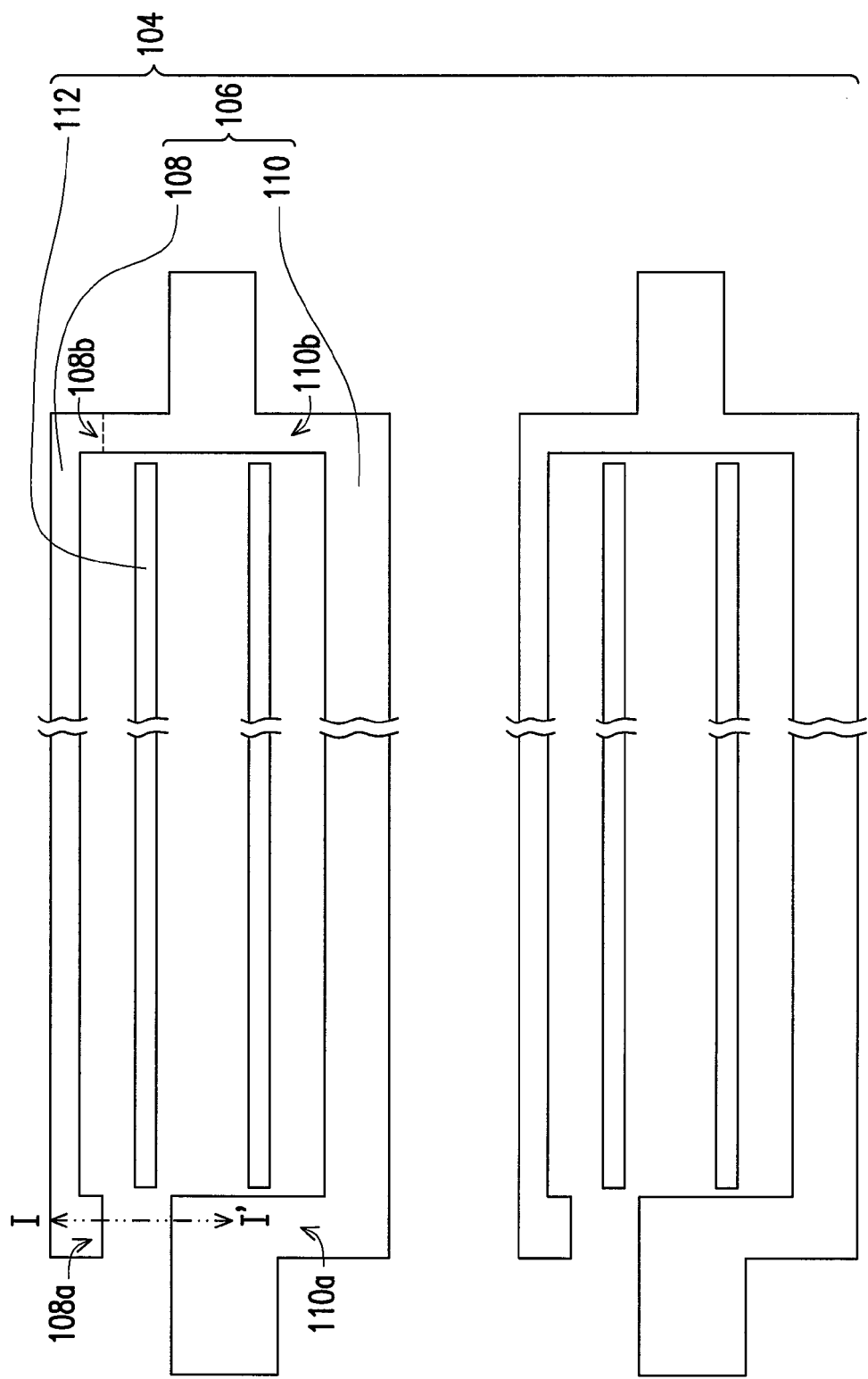
Figure 1B:
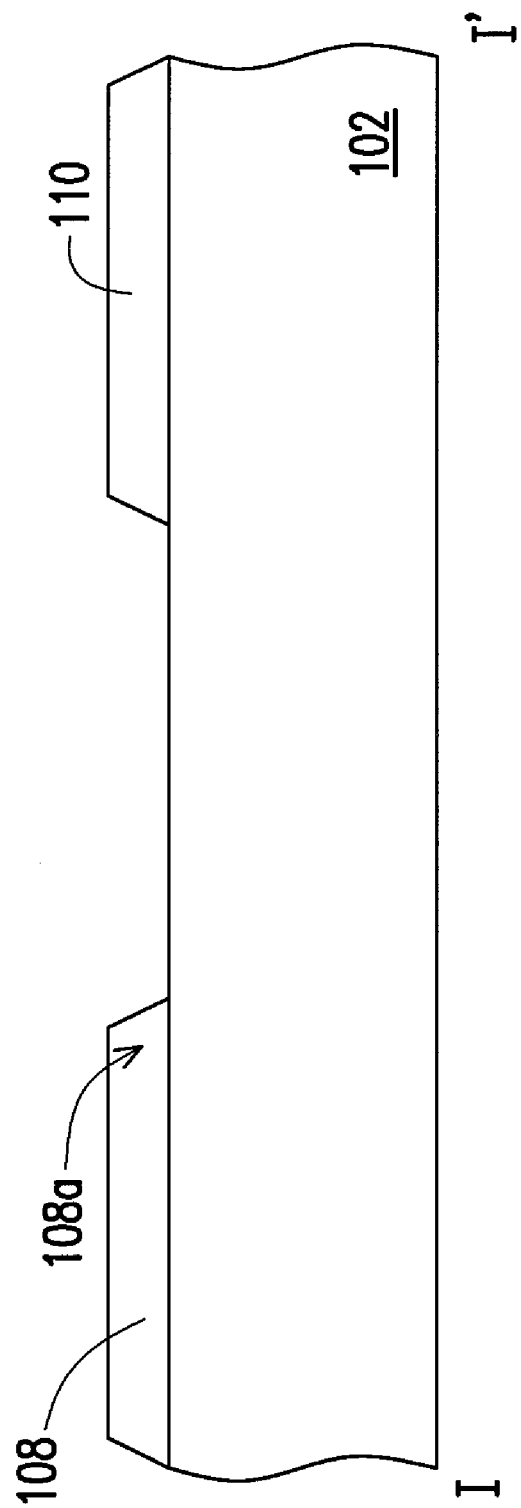
Figure 1C:
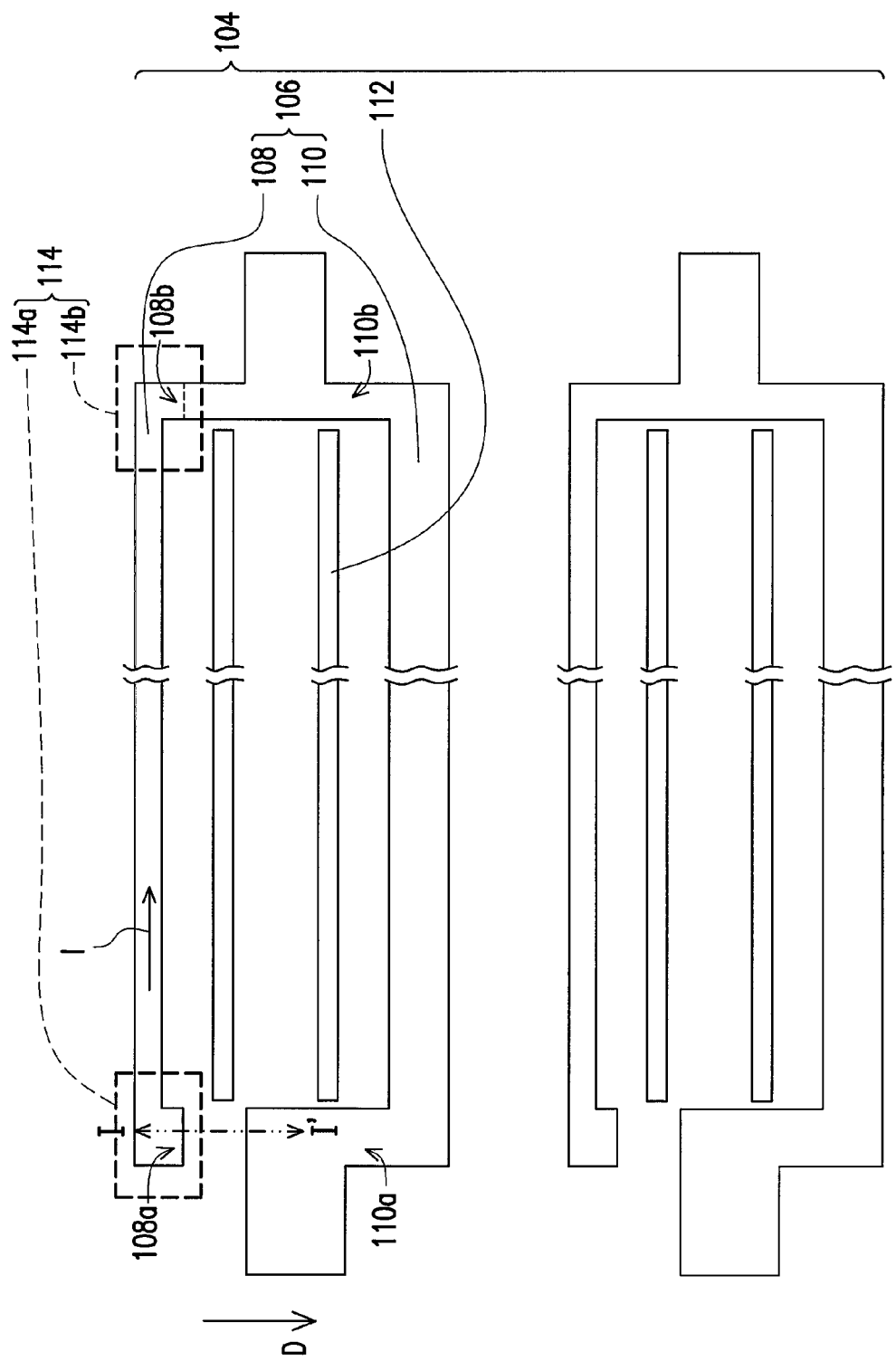
FIG. 1C is a schematic top view of performing an open inspection according to an embodiment of the present invention.

With reference to FIG. 1A and FIG. 1B, a first patterned conductive layer 104 is formed on a substrate 102. The substrate 102 is, for example, a rigid substrate (e.g., a glass substrate), a flexible substrate (e.g., a plastic substrate), or the like. The first patterned conductive layer 104 is made of metal, for instance. Besides, the first patterned conductive layer 104 includes a plurality of scan line patterns 106 separated from one another. Each of the scan line patterns 106 includes a first scan line 108 and a second scan line 110, and the second scan line 110 is adjacent to the first scan line 108. The first scan line 108 has a first contact 108a and a second contact 108b, and the second scan line 110 has a first contact 110a and a second contact 110b. In an embodiment of the present invention, the first contacts 108a of the first scan lines 108 are not connected to the first contacts 110a of the second scan lines 110, while the second contacts 108b of the first scan lines 108 are connected to the second contacts 110b of the second scan lines 110. That is to say, one end of the first scan line 108 is connected to one end of the second scan line 110, while the other end of the first scan line 108 and the other end of the second scan line 110 are not connected, i.e., no electric loop is formed in the present step.

Generally, to improve display quality of pixel units, the first patterned conductive layer 106 further includes at least one common electrode pattern 112 which is coupled to a subsequently formed pixel electrode to form a storage capacitor. The common electrode pattern 112 is not connected to the scan line patterns 106 and is parallel to the first scan line 108 and the second scan line 110, for instance.

In FIG. 1C, an open inspection on the scan line patterns 106 is performed. The step of performing the open inspection on the scan line patterns 106 includes performing a non-contact open inspection on the first scan lines 108 and the second scan lines 110 through the first contacts 108a and 110a. To be more specific, the open inspection is performed by means of a non-contact open inspection machine 114 that includes a test signal generator 114a and a test signal sensor 114b. The test signal generator 114a and the test signal sensor 114b are located on the same horizontal level, for instance. In an embodiment of the present invention, the test signal generator 114a is adapted to having each of the first contacts 108a and 110a generate a sensing current I through current induction, and the test signal sensor 114b is adapted to sensing the sensing current I that passes through each of the first scan lines 108 and each of the second scan lines 110. Here, the test signal sensor 114b senses the sensing current I above each of the second contacts 108b and 110b.

For instance, as indicated in FIG. 1C, when the test signal generator 114a is disposed above the first contact 108a of the first scan line 108, and when the test signal sensor 114b is disposed above the second contact 108b of the same first scan line 108, the sensing current I generated by the first contact 108a is transmitted to the second contact 108b along the corresponding first scan line 108, and the test signal sensor 114b senses the sensing current I and thereby generates a test signal. Given the inspected first scan line 108 is broken, the test signal is changed, i.e., a wave peak is generated; given the inspected first scan line 108 is not broken, the test signal is not drastically changed. Note that the first contact 108a of the first scan line 108 is not connected to the first contact 110a of the second scan line 110, i.e., the first scan line 108 and the second scan line 110 do not form the electric loop. Hence, the sensing current I is not transmitted to the second contact 108b of the first scan line 108 along the second scan line 110. When the first scan line 108 between the first contact 108a and the second contact 108b is broken, the sensing current I generated by the first contact 108a cannot be transmitted to the second contact 108b, such that the test signal sensed by the test signal sensor 114b is remarkably changed. Said design of the scan line patterns 106 is conducive to effective inspection and determination on whether the corresponding first scan line 108 is broken.

According to another embodiment of the present invention, in the open inspection performed by the non-contact open inspection machine 114, it is also likely to place the test signal generator 114a above the first contact 108a of the first scan line 108 and place the test signal sensor 114b above the second contact 110b of the second scan line 110. Thereby, the test signal generator 114a can have the first contact 108a of each of the first scan lines 108 generate the sensing current I through current induction, and the test signal sensor 114b respectively senses the sensing current I that passes through each of the first scan lines 108 between the first contact 108a and the second contact 110b, so as to inspect whether disconnection defects exist in the corresponding first scan line 108 or not. Here, the test signal sensor 114b senses the sensing current I above the second contact 110b of each of the second scan lines 110.

In addition, another open inspection on the two ends of the common electrode pattern 112 can also be performed by the non-contact open inspection machine 114 in a similar way, so as to determine whether the disconnection defects exist in the common electrode pattern 112 or not. In an embodiment of the present invention, the non-contact open inspection machine 114 moves along an inspection direction D, so as to perform the non-contact open inspection on the first scan lines 108, the common electrode pattern 112, and the second scan lines 110 one by one. In FIG. 1C, the inspection direction D is a top-to-bottom direction, which is not limited in this invention. Namely, the moving direction of the non-contact open inspection machine 114 can be adjusted based on manufacturing requirements.

Figure 2A:
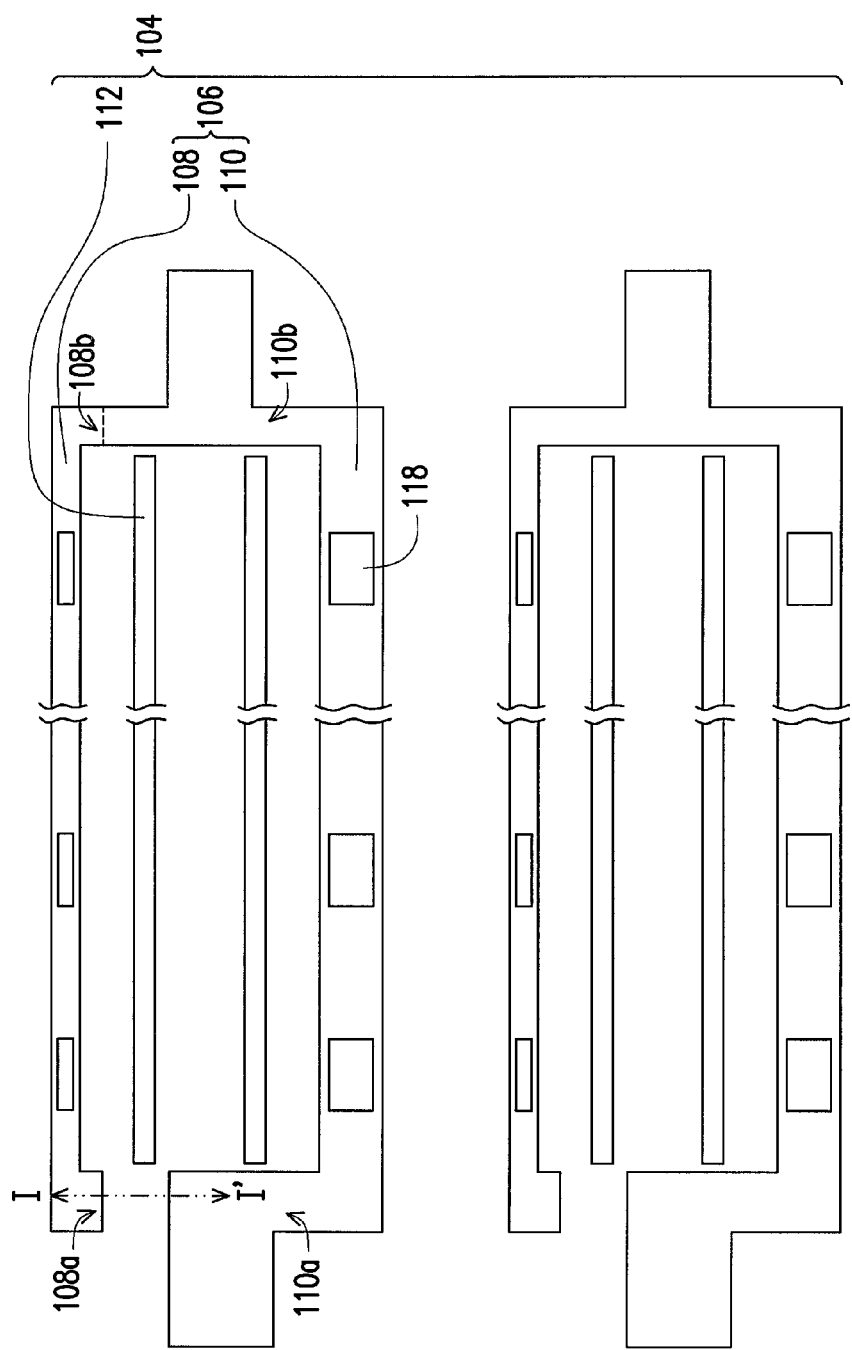
Figure 2B:
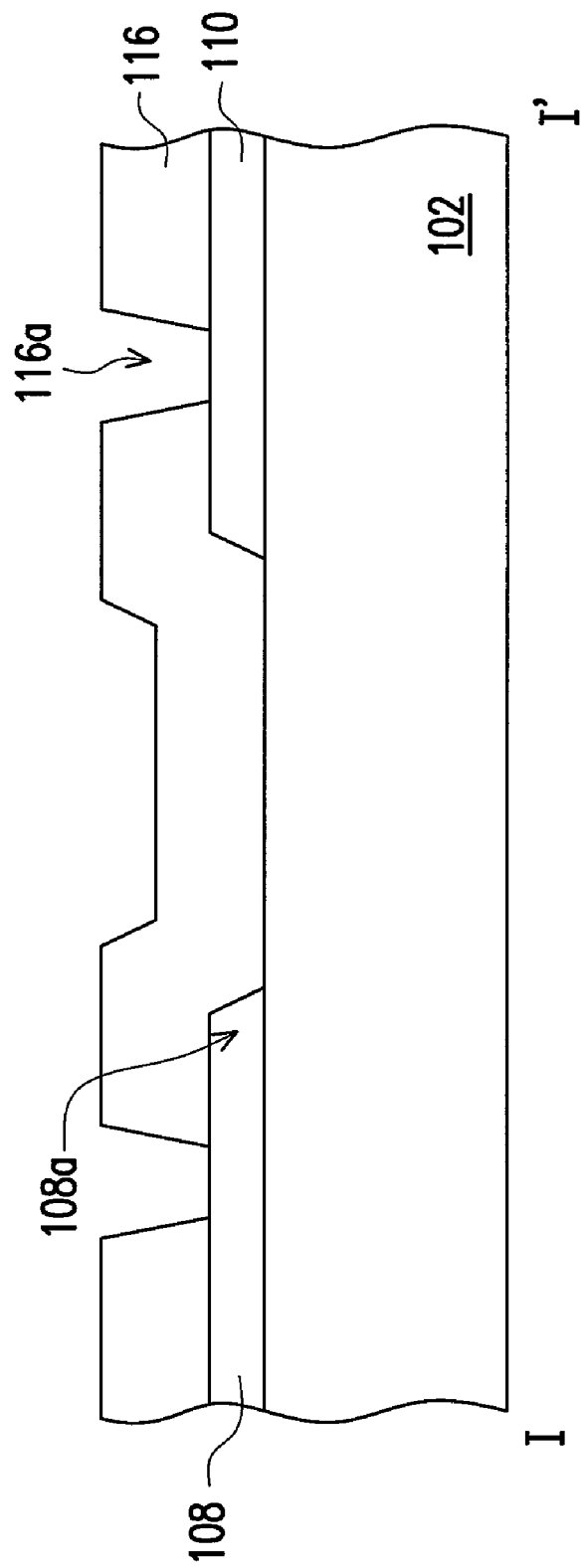

With reference to FIG. 2A and FIG. 2B, an insulating layer 116 is formed on the substrate 102 to cover the first patterned conductive layer 104. Here, the insulating layer 116 serves as a gate insulating layer. The insulating layer 116 can have a single-layered structure or a multi-layered structure and can be made of dielectric materials, for example, silicon nitride, silicon oxide, silicon oxynitride, and so forth. In an embodiment of the present invention, a plurality of contacts 116a are formed in the insulating layer 116, and the contacts 116a expose the scan line patterns 106 disposed below the contacts 116a. The contacts 116a are disposed corresponding to the first contacts 108a of the first scan lines 108 and the first contacts 110a of the second scan lines 110, for instance. A plurality of channel layers 118 are then formed on the substrate 102 where a TFT is to be formed. The channel layers 118 are, for example, formed by forming a channel material layer and patterning the channel material layer, so as to remove the channel material layer not right above the gate. Here, the channel layers 118 are made of amorphous silicon (a-Si), for instance.

Figure 3A:
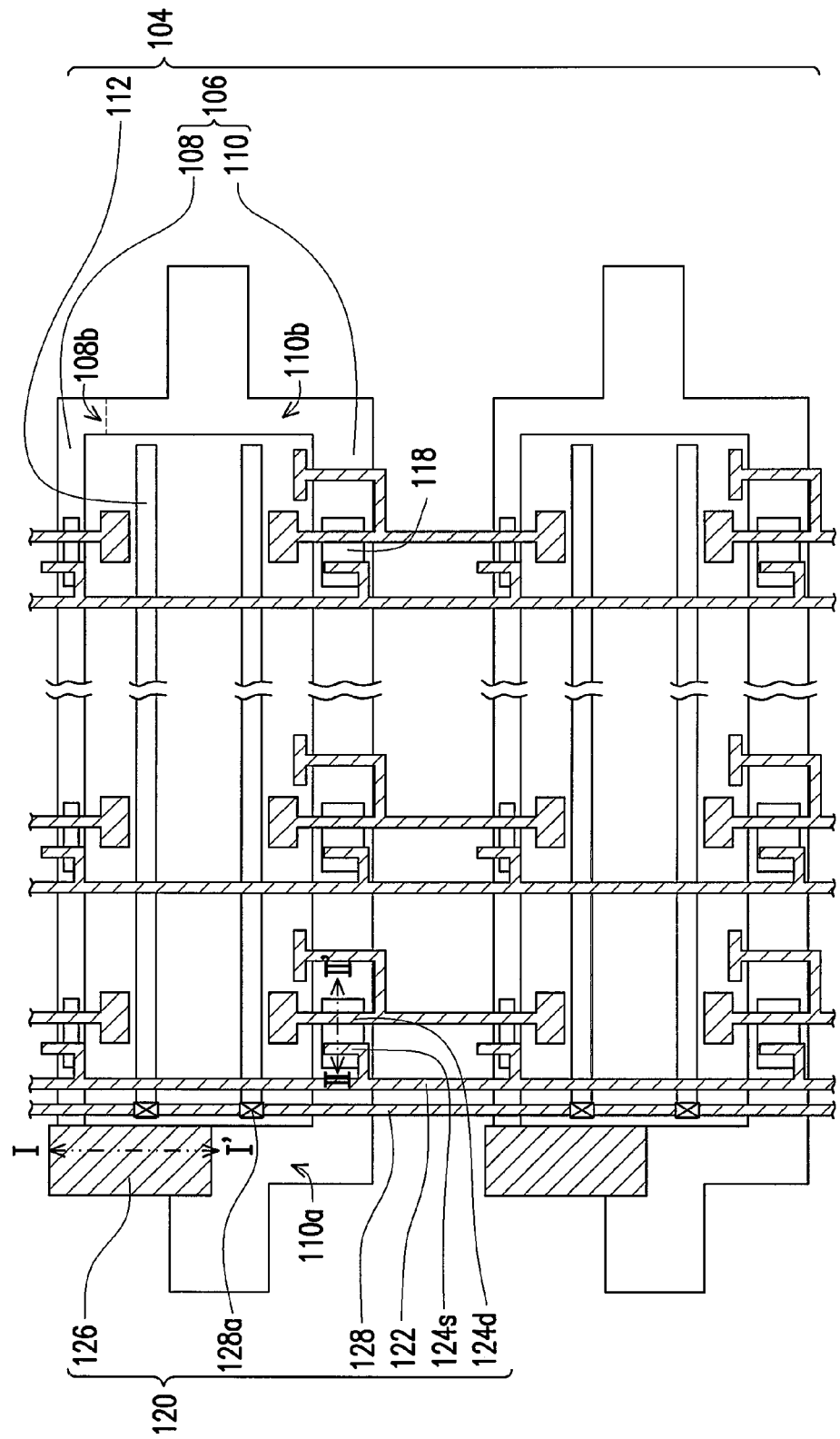
Figure 3B:
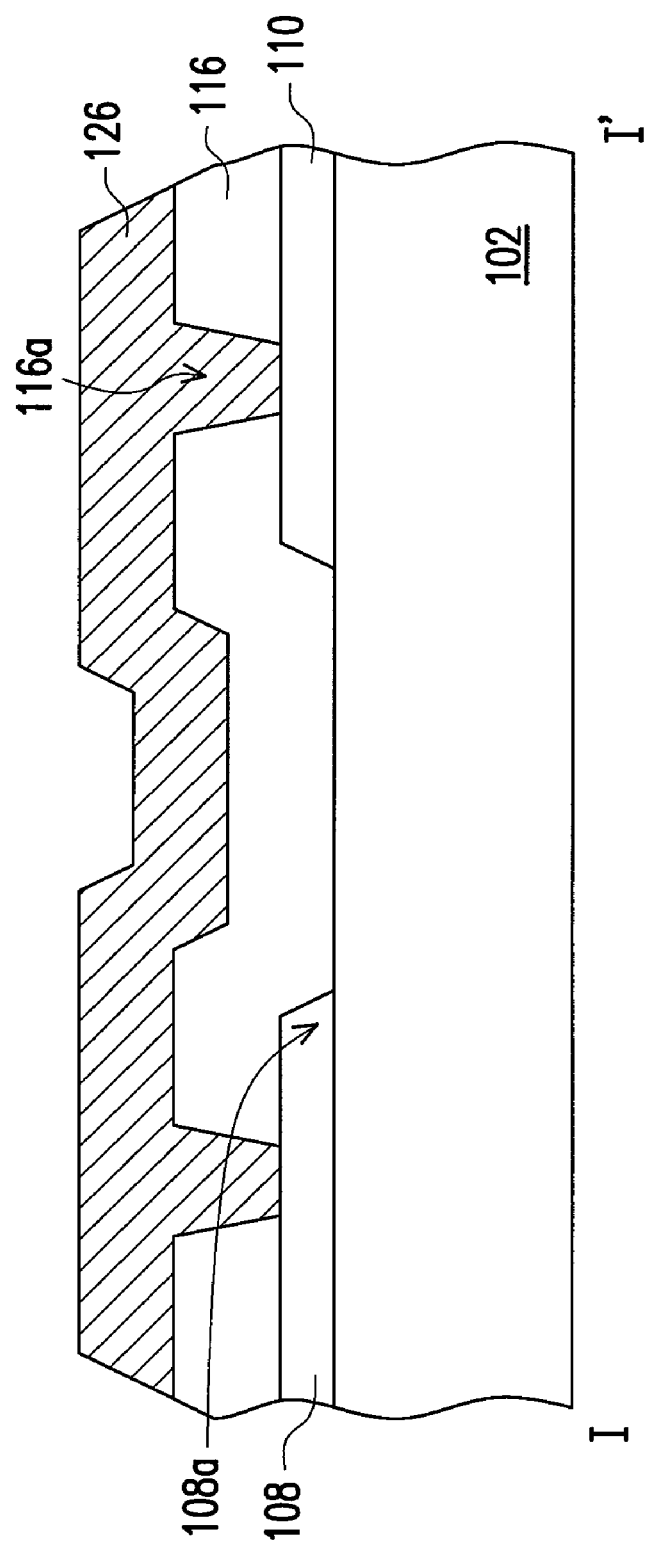
Figure 3C:
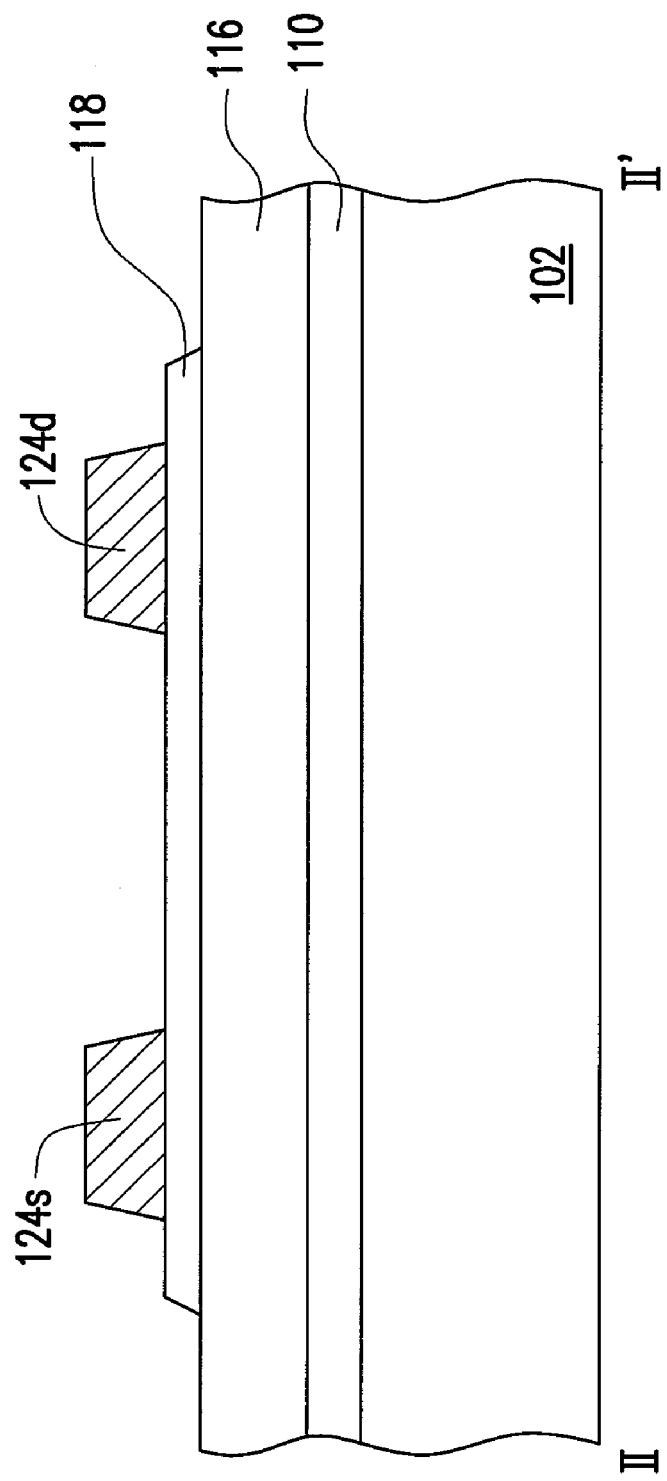
FIG. 3C is a schematic cross-sectional view taken along a line segment II-II' depicted in FIG. 3A.

With reference to FIG. 3A, FIG. 3B, and FIG. 3C, a second patterned conductive layer 120 is formed on the substrate 102. The second patterned conductive layer 120 is made of metal, for instance. Besides, the second patterned conductive layer 120 includes a plurality of data lines 122, a plurality of sources 124s and drains 124d, and a plurality of connectors 126. The data lines 122 are interlaced with the first scan lines 108 and the second scan lines 110. As indicated in FIG. 3C, the sources 124s and the drains 124d are located above the channel layers 118, and the channel layers 118 are located above the scan line patterns 106, so as to form a bottom-gate active device structure. The sources 124s are electrically connected to the data lines 122 correspondingly. The connectors 126 are located above and across the first contacts 108a of the first scan lines 108 and the first contacts 110a of the second scan lines 110. Since the contacts 116a are formed in the insulating layer 116, the contacts 116a are respectively filled with the connectors 126, such that the first contacts 108a of the first scan lines 108 and the first contacts 110a of the second scan lines 110 are electrically connected through the corresponding contacts 116a. As such, at least one of the connectors 126 electrically connects the first scan line 108 and the second scan line 110 in each of the scan line patterns 106 directly, so as to form an electric loop.

In addition, the second patterned conductive layer 120 can further include at least one common bus line 128. The common bus line 128 is, for instance, disposed on one side or two respective sides of a plurality of common electrode patterns 112, and the common bus line 128 can connect at least parts of or all of the underlying common electrode patterns 112 through the contacts 128a.

Figure 4A:
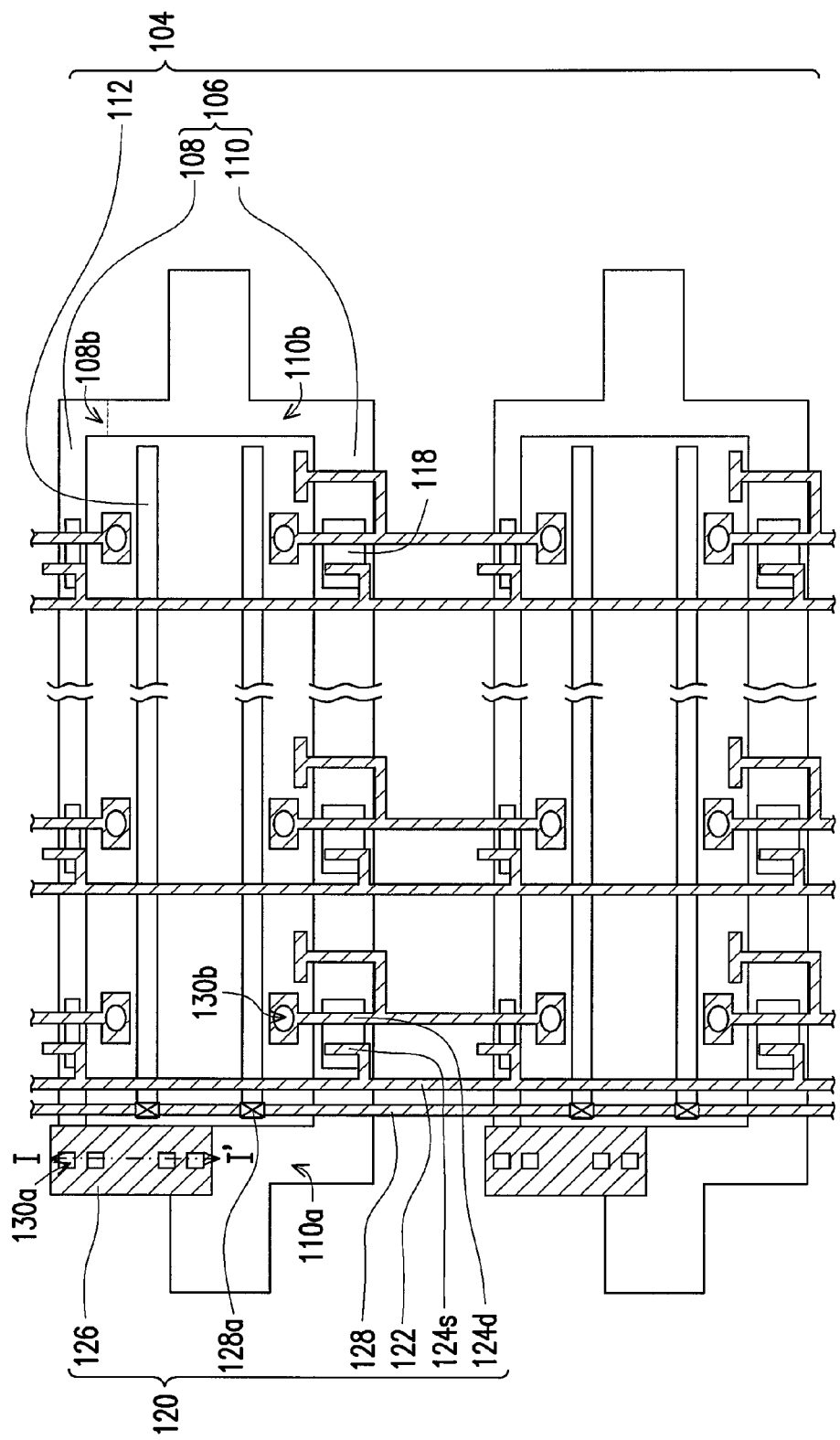
Figure 4B:
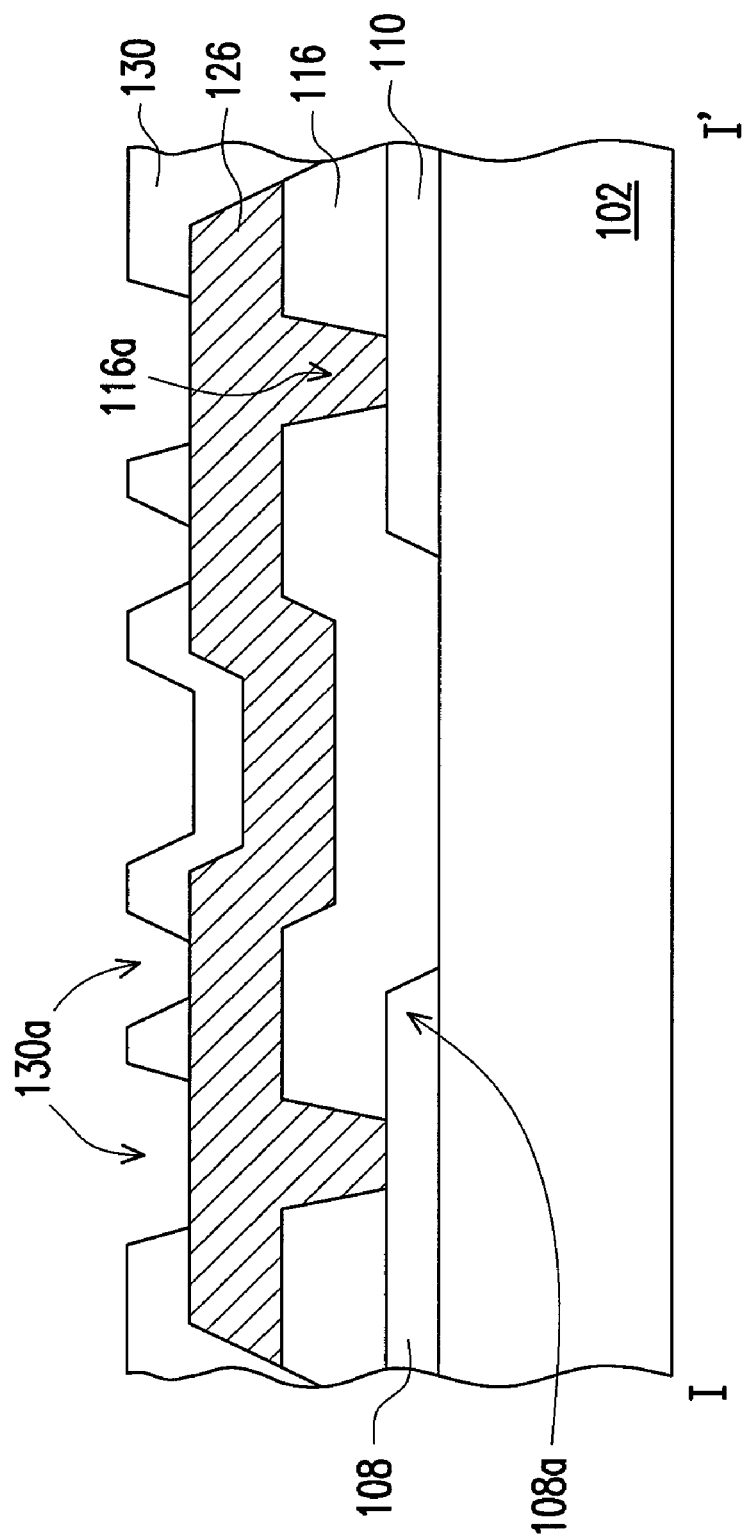

With reference to FIG. 4A and FIG. 4B, a passivation layer 130 is formed on the substrate 102 to cover the second patterned conductive layer 120. The passivation layer 130 has contacts 130a and 130b. The contacts 130a are located above the contacts 116a of the insulating layer 116 and expose the connectors 126. Besides, the contacts 130a can be selectively located in areas not right above the contacts 116a. The contacts 130b expose a portion of the second patterned conductive layer 120 acting as the drains 124d. The passivation layer 130 can have a single-layered or multiple-layered structure, and the material thereof is an inorganic material, an organic material, or a combination of the above, for instance.

Figure 5A:
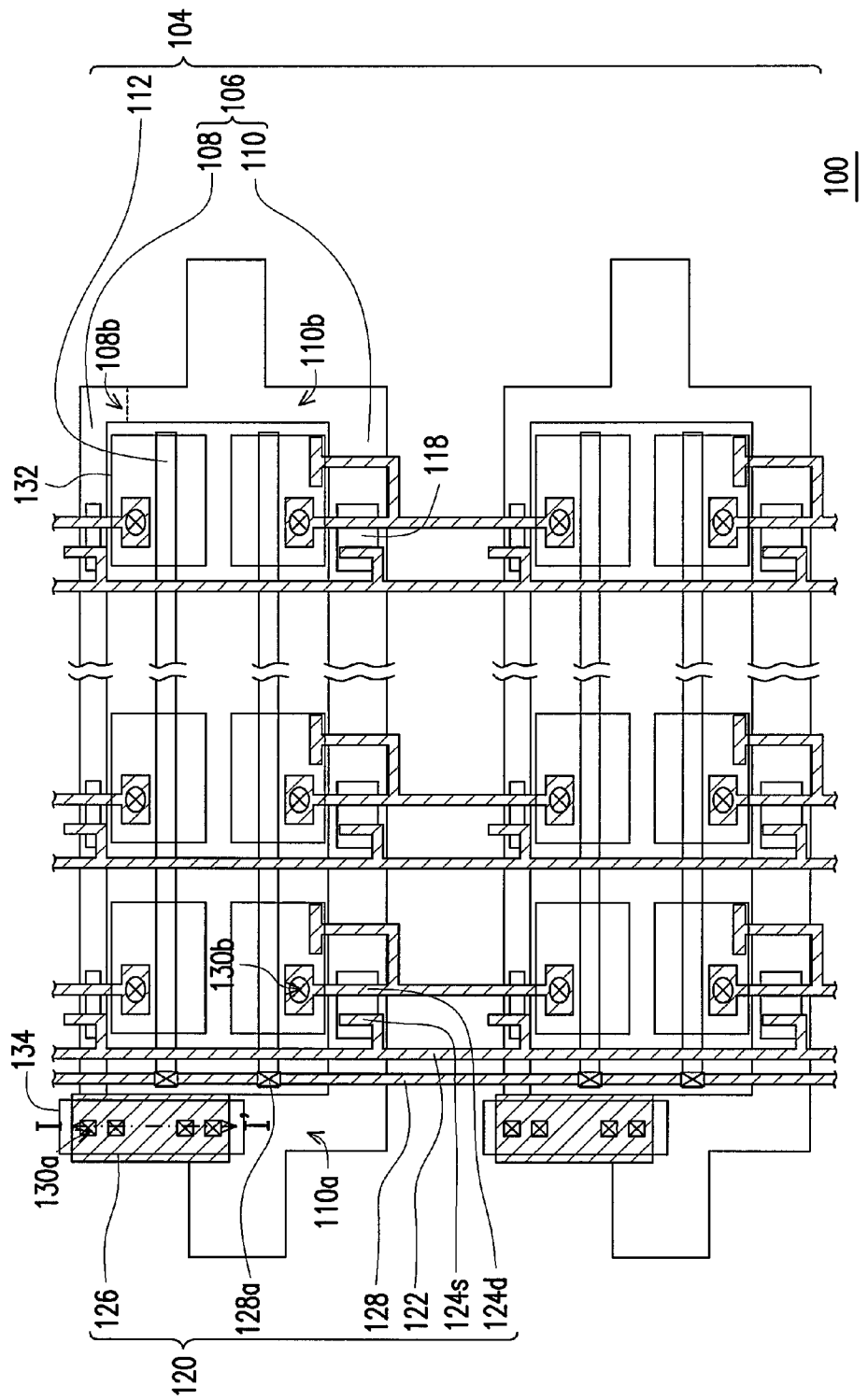
Figure 5B:
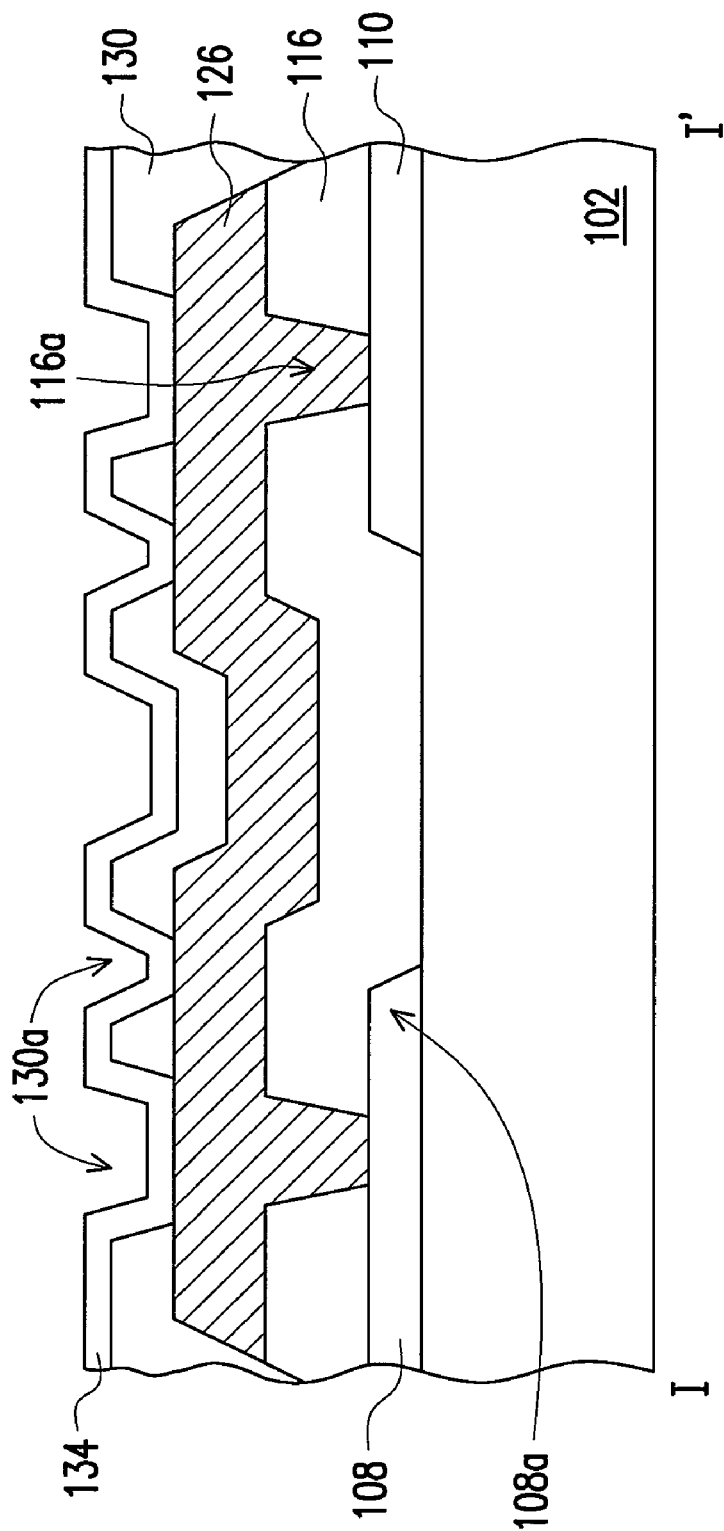

With reference to FIG. 5A and FIG. 5B, a plurality of pixel electrodes 132 and a plurality of conductive layers 134 are formed on the substrate 102, so as to complete the fabrication of the active device array substrate 100 of the present embodiment. The pixel electrodes 132 and the conductive layers 134 are disposed on the passivation layer 130, and the conductive layers 134 can be electrically connected to the connectors 126 through the contacts 130a. The pixel electrodes 132 can be electrically connected to the drains 124d through the contacts 130b. The pixel electrodes 132 and the conductive layers 134 can be made of the same transparent conductive material, for example, indium tin oxide (ITO), indium zinc oxide (IZO), Al doped ZnO (AZO), indium-gallium-zinc oxide (IGZO), Ga doped zinc oxide (GZO), zinc-tin oxide (ZTO), $In_2O_3$, ZnO, or $SnO_2$.

Figure 6:
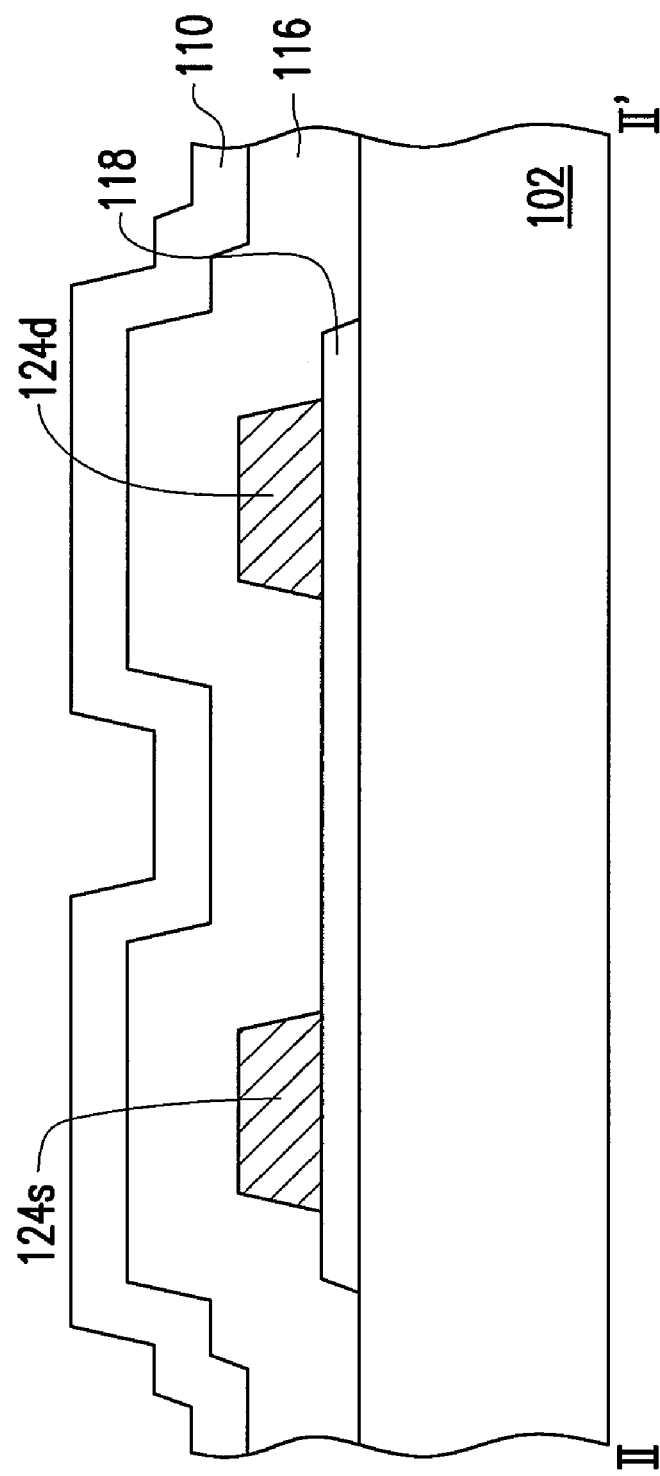
FIG. 6 is a schematic cross-sectional view showing an active device structure according to another embodiment of the present invention.

It should be mentioned that the active device has the exemplary bottom-gate structure according to the previous embodiment as shown in FIG. 3A and FIG. 3B, which is however not limited in the present invention. In another embodiment of the present invention, other active device structures, e.g., a top-gate active device structure, can be formed by applying the method for forming the active device array substrate of the present invention. FIG. 6 is a schematic cross-sectional view showing an active device structure according to another embodiment of the present invention. Identical elements in the drawings are represented by the same reference numbers and thus will not be described again.

As indicated in FIG. 6, the channel layers 118 can be formed below the scan line patterns 106. Namely, in the bottom-gate active device structure, the insulating layer 116 and the channel layers 118 are formed after the first patterned conductive layer 104 is formed and before the second patterned conductive layer 120 is formed. In the top-gate active device structure of this embodiment, components are formed in a different sequence. Namely, the channel layers 118, the second patterned conductive layer 120 at least including the sources 124s and the drains 124d, the insulating layer 116, and the first patterned conductive layer 104 (i.e., the second scan lines 110 shown in FIG. 6) that serves as the gate are sequentially formed on the substrate 102.

FIG. 7A to FIG. 10A are schematic top views showing a fabricating process of an active device array substrate according to a second embodiment of the present invention. FIG. 7B to FIG. 10B are schematic cross-sectional views taken along a line segment III-III' depicted in FIG. 7A to FIG. 10A, respectively. Note that the fabricating process shown in FIG. 7A to FIG. 10A follow the steps depicted in FIG. 1A.

In FIG. 7A to FIG. 10A, identical elements are represented by the same reference numbers and therefore will not be further described herein.

Figure 7A:
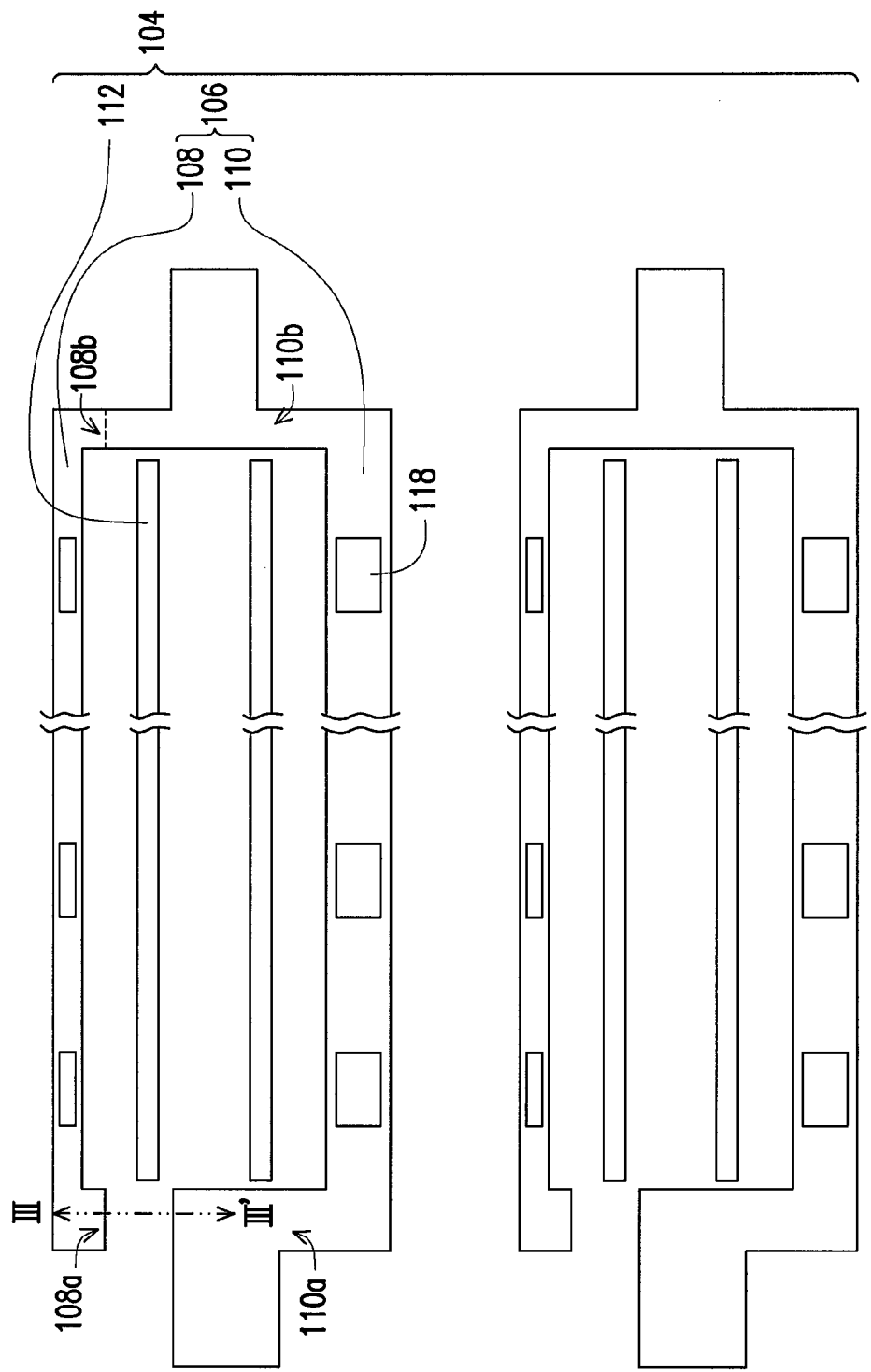
Figure 7B:
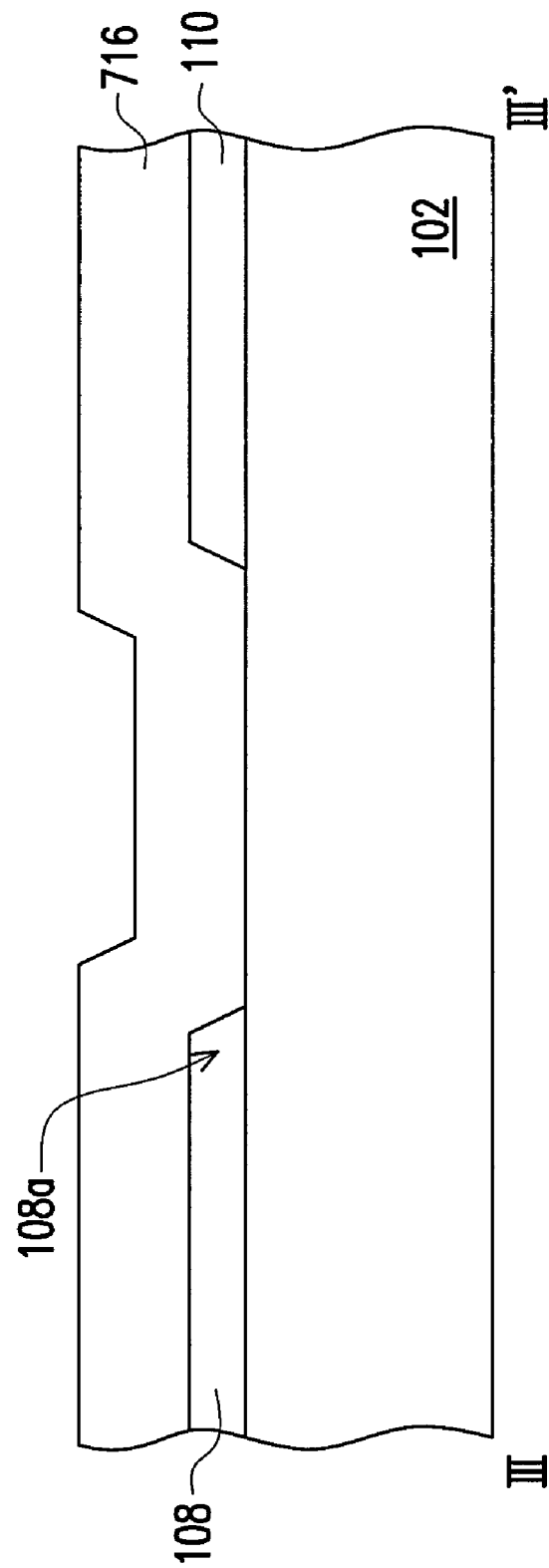

As indicated in FIG. 7A and FIG. 7B, after the open inspection on the scan line patterns 106 and the common electrode patterns 112 is performed, an insulating layer 716 is formed on the substrate 102 to entirely cover the first patterned conductive layer 104. Here, the insulating layer 716 serves as the gate insulating layer. After that, the channel layers 118 are formed on the substrate 102 where a TFT is to be formed. The channel layers 118 are located above the scan line patterns 106 to form the bottom-gate active device structure.

Figure 8A:
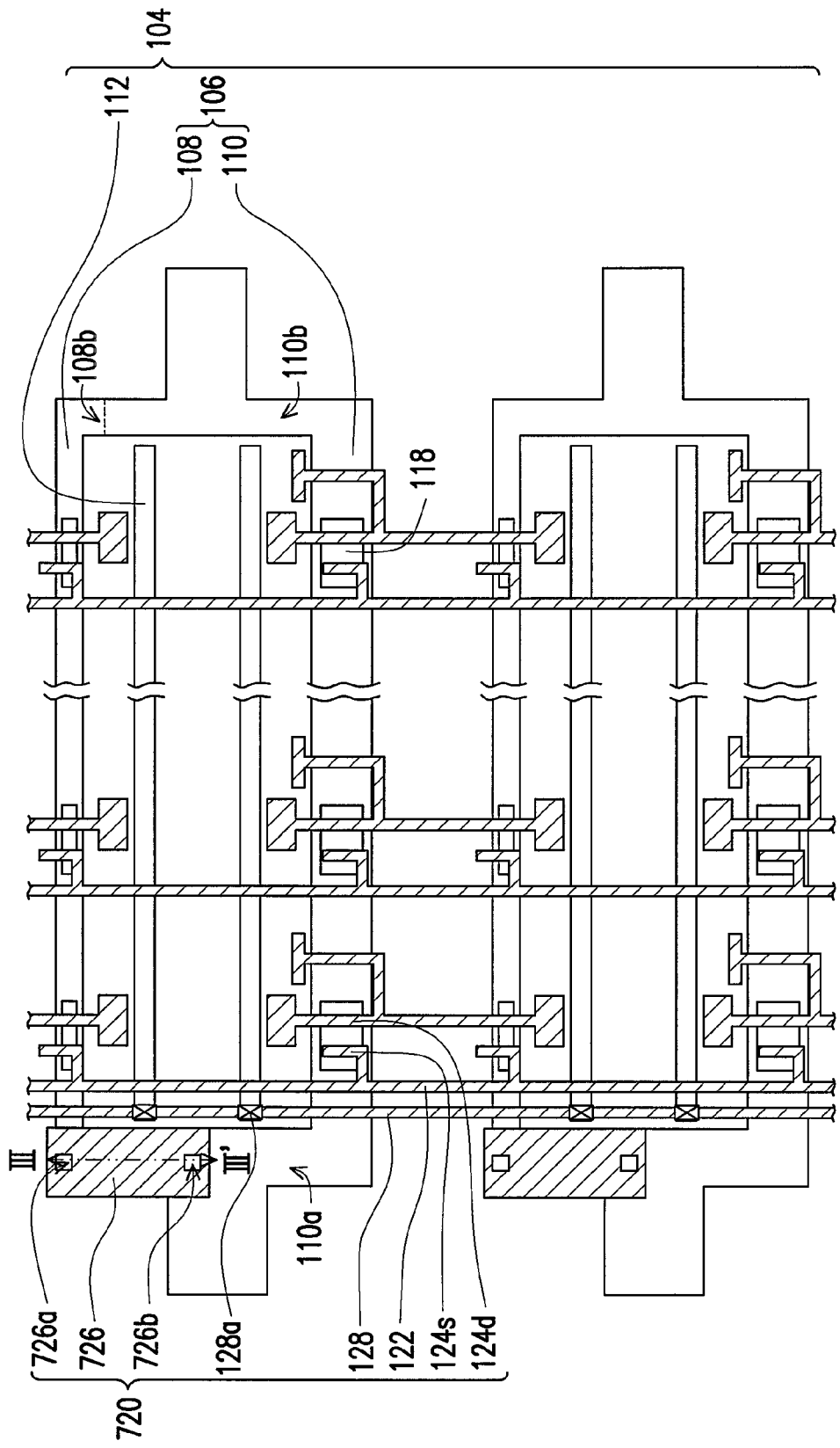
Figure 8B:
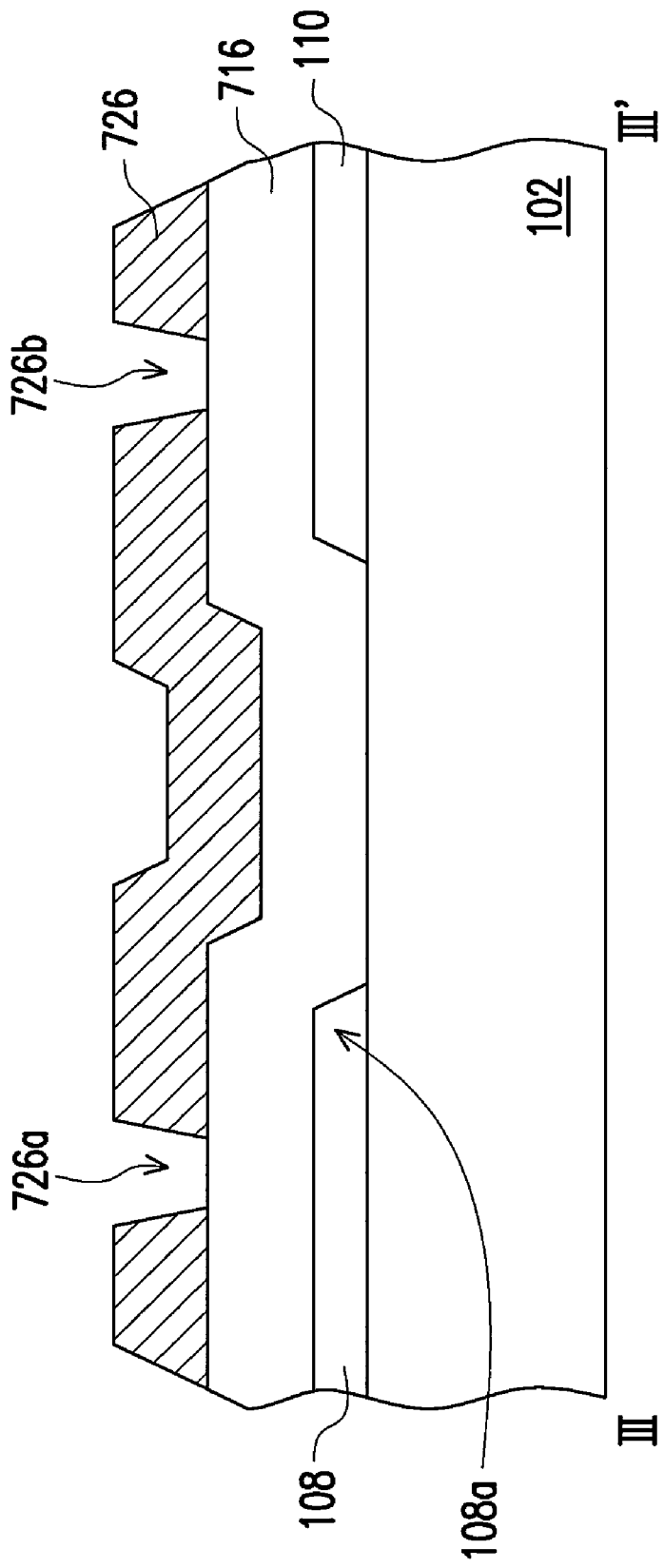

With reference to FIG. 8A and FIG. 8B, a second patterned conductive layer 720 is formed on the substrate 102. The second patterned conductive layer 720 includes a plurality of data lines 122, a plurality of sources 124s and drains 124d, and a plurality of first connectors 726. The second patterned conductive layer 720 selectively includes at least one common bus line 128. The first connectors 726 are located above and across the first contacts 108a of the first scan lines 108 and the first contacts 110a of the second scan lines 110, for instance. Besides, the first connectors 726 have openings 726a and 726b exposing the insulating layer 716.

Figure 9A:
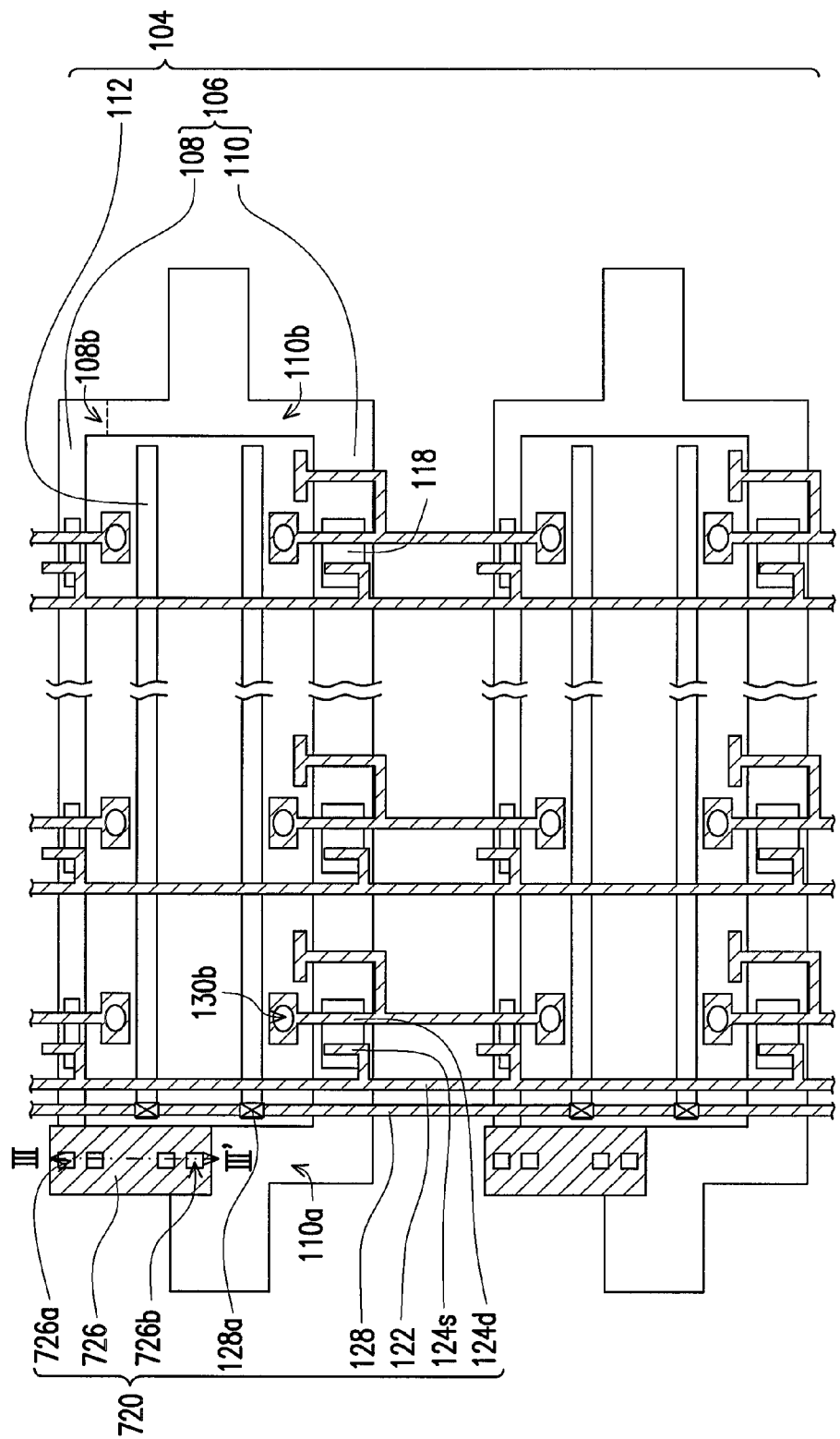
Figure 9B:
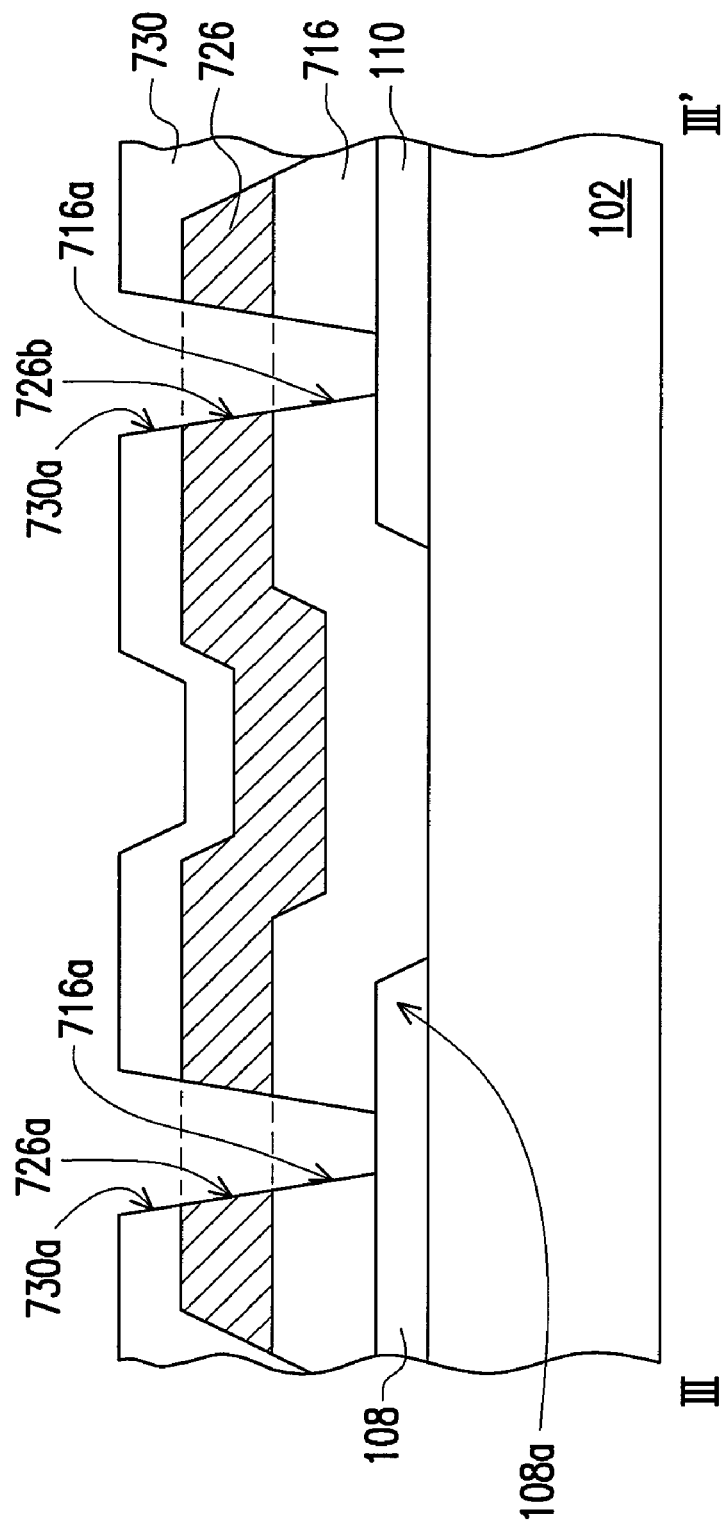

With reference to FIG. 9A and FIG. 9B, a passivation layer 730 is formed on the substrate 102 to cover the second patterned conductive layer 720. After that, the passivation layer 730 and the insulating layer 716 are patterned, such that the passivation layer 730 has a plurality of first contacts 730a, and that the insulating layer 716 has a plurality of second contacts 716a. In an embodiment of the present invention, the first contacts 730a are located above the openings 726a and 726b of the first connectors 726, and the second contacts 716a are located below the openings 726a and 726b of the first connectors 726. The first contacts 730a, the openings 726a, and the second contacts 716a close to the first contacts 108a of the first scan lines 108 commonly expose the underlying scan line patterns 106; the first contacts 730a, the openings 726b, and the second contacts 716a close to the first contacts 110a of the second scan lines 110 commonly expose the underlying scan line patterns 106.

Figure 10A:
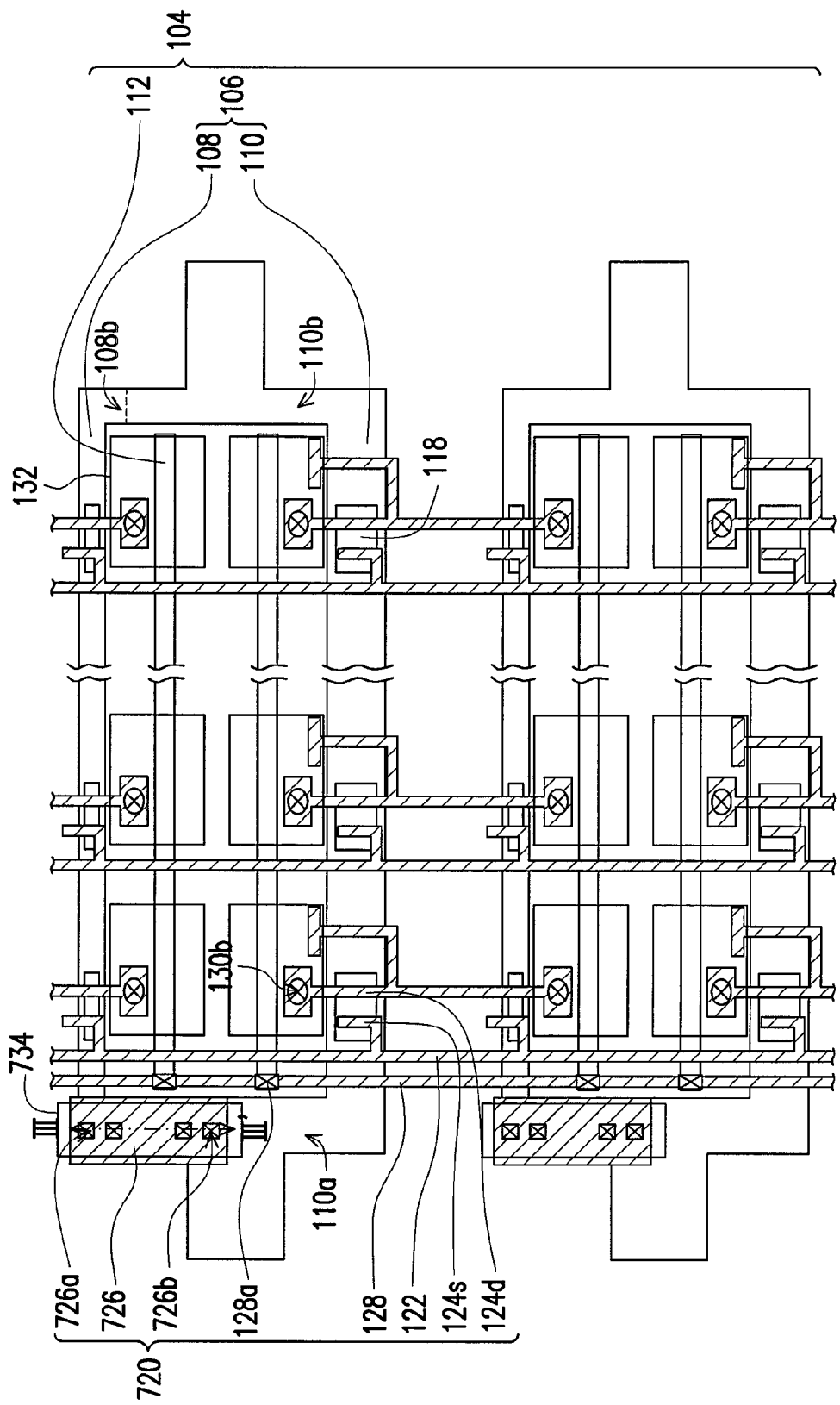
Figure 10B:
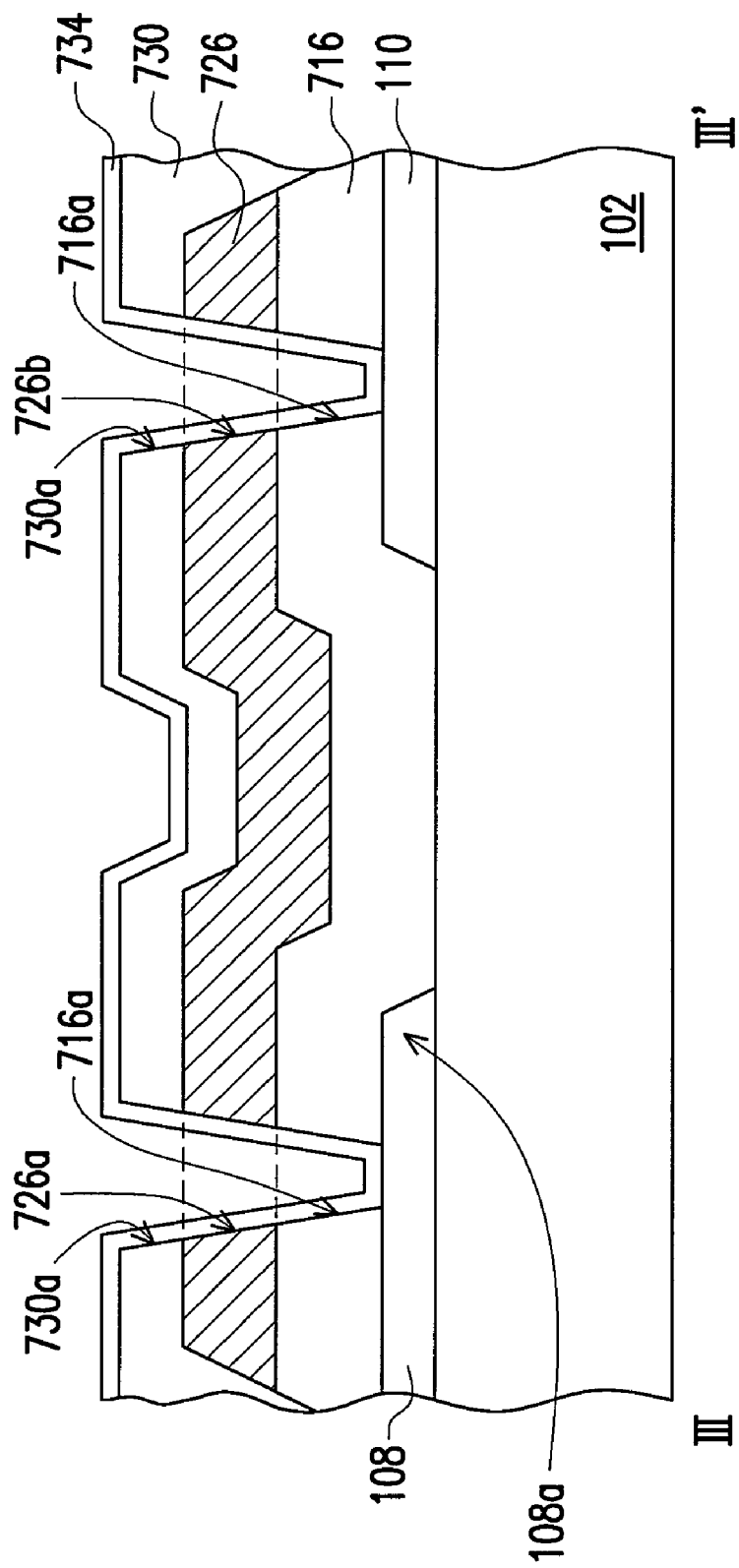

With reference to FIG. 10A and FIG. 10B, a third patterned conductive layer is formed on the substrate 102. The third patterned conductive layer includes a plurality of pixel electrodes 132 and a plurality of second connectors 734, and the pixel electrodes are connected to the drains 124d. The second connectors 734 and the pixel electrodes 132 are made of the same material, for instance, a transparent conductive material. Since the first contacts 730a, the openings 726a, the openings 726b, and the second contacts 716a commonly expose the underlying scan line patterns 106, the second scan lines 110 can be electrically connected to the corresponding first scan lines 108 through the first connectors 726 and the second connectors 734, so as to form a electric loop. In each of the scan line patterns 106, each of the second connectors 734 is electrically connected to the first contact 108a of the first scan line 108 through a corresponding one of the openings 726a, a corresponding one of the first contacts 730a, and a corresponding one of the second contacts 716a; each of the second connectors 734 is electrically connected to the first contact 110a of the second scan line 110 through a corresponding one of the openings 726b, a corresponding one of the first contacts 730a, and a corresponding one of the second contacts 716a.

Figure 10C:
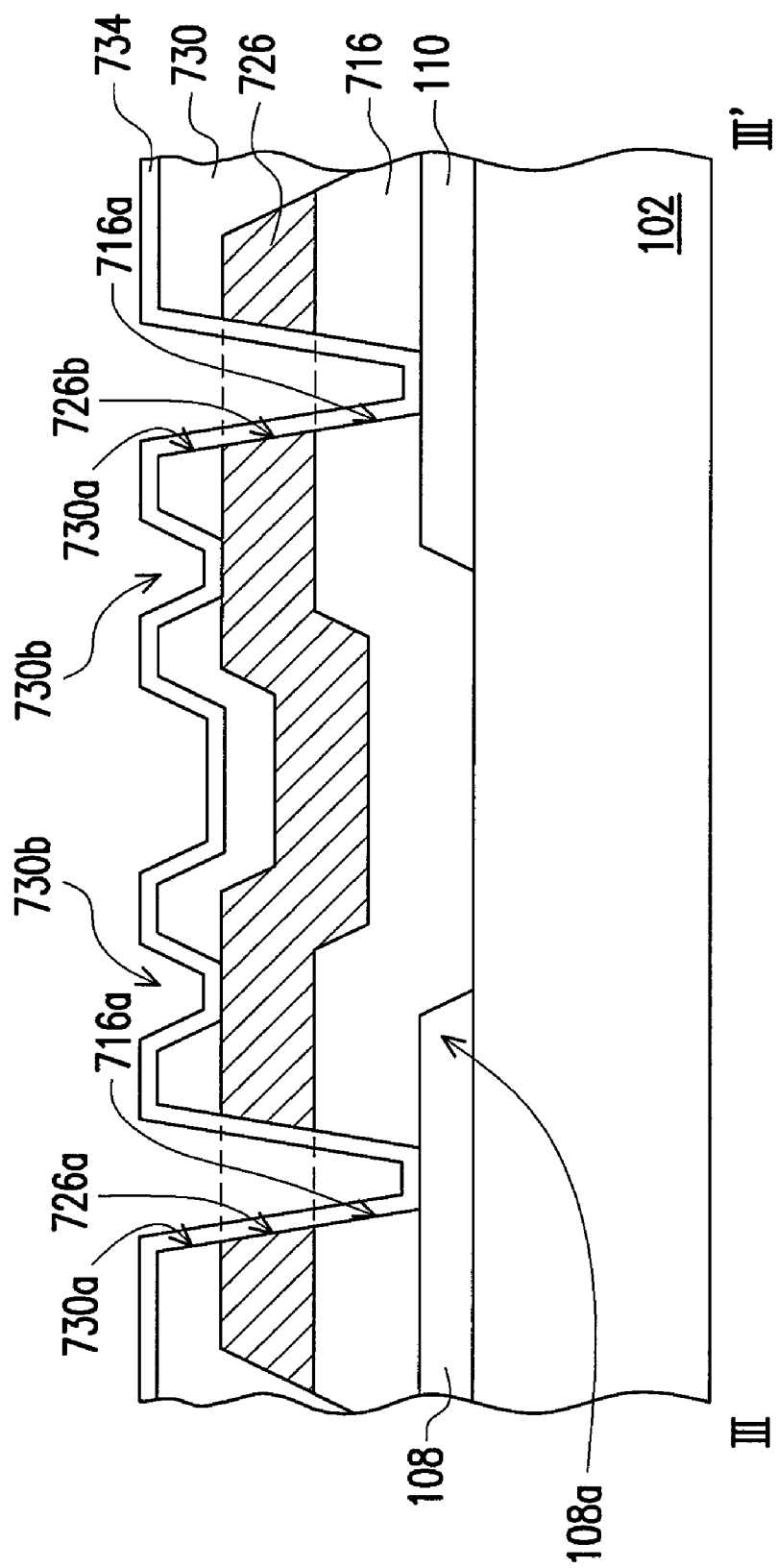
FIG. 10C is a schematic cross-sectional view taken along the line segment III-III' depicted in FIG. 10A according to another embodiment of the present invention.

It should be mentioned that the first contacts 730a are merely disposed above the corresponding openings 726a and 726b of the first connectors 726, i.e., two ends of each of the first connectors 726 exemplarily act as side contacts. However, the present embodiment can also be embodied in other manner. FIG. 10C is a schematic cross-sectional view taken along the line segment depicted in FIG. 10A according to another embodiment of the present invention. Identical elements in FIG. 10B and in other drawings are represented by the same reference numbers, and therefore detailed descriptions of the identical elements are not repeated hereinafter.

With reference to FIG. 10C, in another embodiment of the present invention, the passivation layer 730 and the insulating layer 716 are patterned, such that the passivation layer 730 has a plurality of first contacts 730a, and that the insulating layer 716 has a plurality of second contacts 716a. Parts of the first contacts 730a in the passivation layer 730 are located above the openings 726a and 726b of the first connectors 726, that is, the parts of the first contacts 730a in the passivation layer 730 are overlapped with the openings 726a and 726b of the first connectors 726, while the passivation layer 730 further has first contacts 730b located in areas not right above the openings 726a and 726b. The first contacts 730b expose the first connectors 726. Each of the second connectors 734 is connected to the first contact 108a of the corresponding first scan line 108 and the first contact 110a of the corresponding second scan line 110 through a corresponding one of the openings 726a, a corresponding one of the openings 726b, a corresponding one of the first contacts 730a, and a corresponding one of the second contacts 716a. Besides, the second connectors 734 can be connected to the first connectors 726 through the first contacts 730b, respectively, so as to further ensure the electrical connection between the first connectors 726 and the first and second scan lines 108 and 110.

Figure 11:
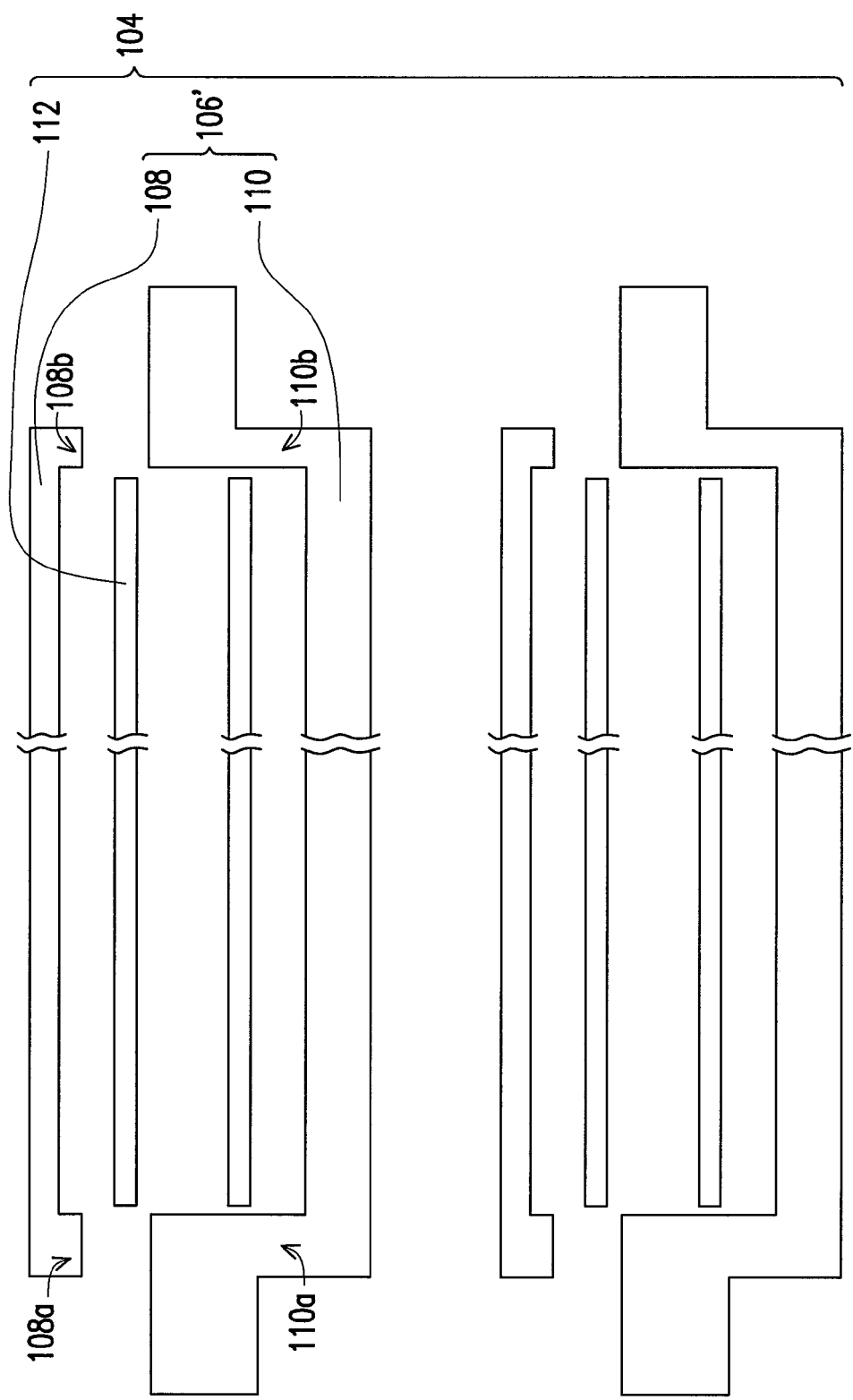
FIG. 11 to FIG. 12 are schematic top views showing a fabricating process of an active device array substrate according to a third embodiment of the present invention.
Figure 12:
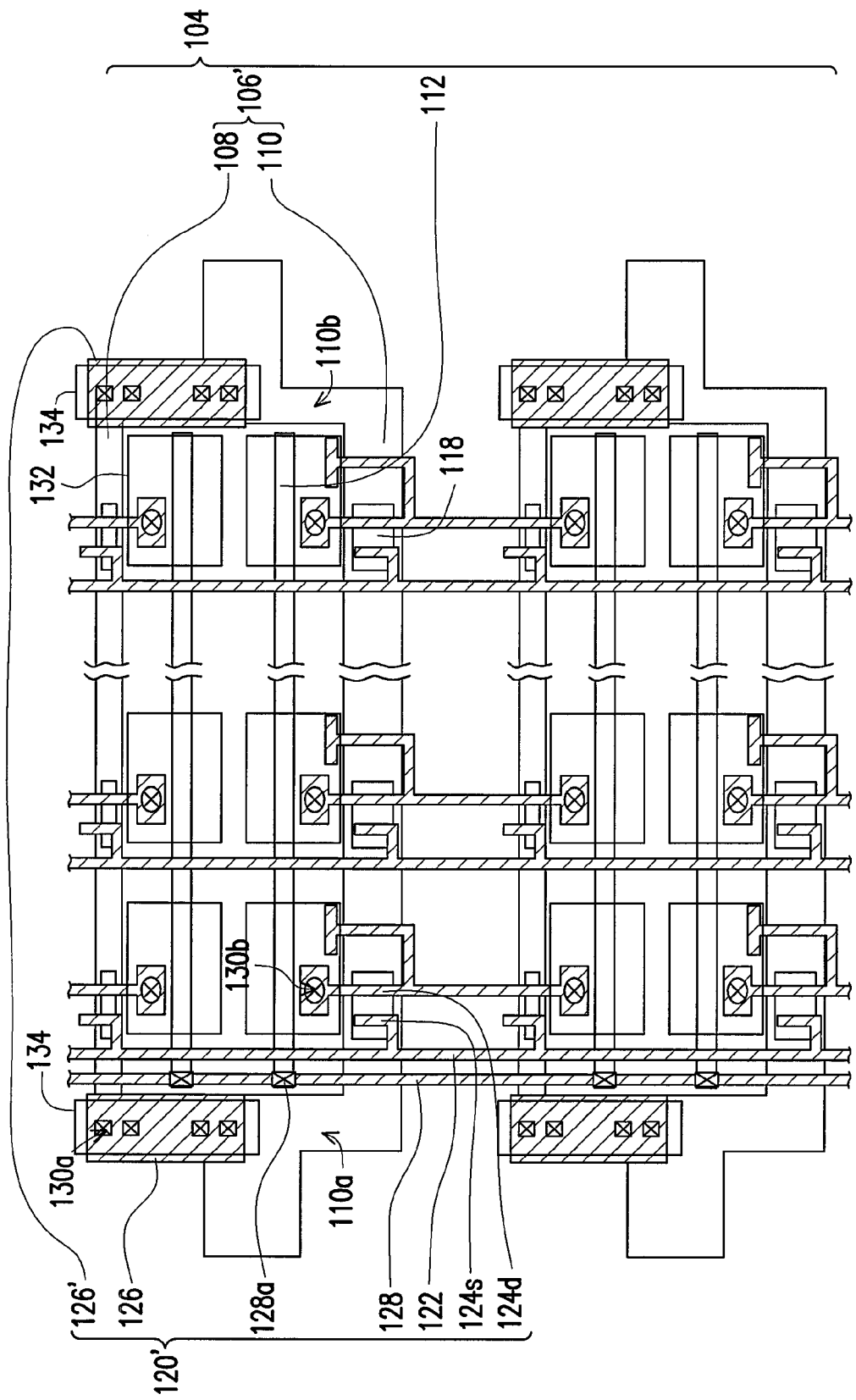

FIG. 11 to FIG. 12 are schematic top views showing a fabricating process of an active device array substrate according to a third embodiment of the present invention. It should be noted that in FIG. 11 to FIG. 12, the same elements as those in other drawings are marked by the same reference numerals, and relevant descriptions are omitted.

With reference to FIG. 11, in the step of forming the first patterned conductive layer 104 on the substrate 102, the first contacts 108a of the first scan lines 108 are not connected to the first contacts 110a of the second scan lines 110, and the second contacts 108b of the first scan lines 108 are not connected to the second contacts 110b of the second scan lines 110, for instance. That is to say, in each of the scan line patterns 106', two ends of the first and second scan lines 108 and 110 are not connected, such that the two scan lines 108 and 110 are completely separated. Therefore, no electric loop is formed in the present step.

An open inspection on the scan line patterns 106' is performed. The open inspection, similar to that depicted in FIG. 1C, is performed by a non-contact open inspection machine that includes a test signal generator and a test signal sensor. According to an embodiment of the present invention, the test signal generator has the first contact 108a of each of the first scan lines 108 and the first contact 110a of each of the second scan lines 110a generate a sensing current, and the test signal sensor is adapted to sensing the sensing current that passes through each of the first scan lines 108 and each of the second scan lines 110. Here, the test signal sensor senses the sensing current above the second contact 108b of each of the first scan lines 108 and the second contact 110b of each of the second scan lines 110. Thereby, whether the corresponding first scan line 108 or the second scan line 110 is broken or not can be effectively inspected and determined.

After the open inspection on the scan line patterns 106' and the common electrode pattern 112 is performed, subsequent processes are performed to complete the fabrication of the active device array substrate. As shown in FIG. 12, the two ends of the first and second scan lines 108 and 110 are not connected, and therefore the second patterned conductive layer 120' further includes a plurality of connectors 126' which are located above and across the first contacts 108a of the first scan lines 108 and the first contacts 110a of the second scan lines 110. Thus, the connectors 126 can electrically connect the first contacts 108a of the first scan lines 108 and the first contacts 110a of the second scan lines 110 through the corresponding contacts 116a above the scan line patterns 106', and the connectors 126' can electrically connect the second contacts 108b of the first scan lines 108 and the second contacts 110b of the second scan lines 110 through the corresponding contacts 116a above the scan line patterns 106'.

Note that the channel layers can be formed above the scan line patterns (the bottom-gate active device structure) in the second embodiment, or the channel layers can be formed below the scan line patterns (the top-gate active device structure) in the third embodiment. The scan line patterns can also include one or more second scan lines, which should be known to people having ordinary skill in the art and thus will not be described herein.

In light of the foregoing, the active device array substrate and the method for fabricating the same according to the present invention have at least the following advantages:

1. In the step of forming the first patterned conductive layer, no electric loop is formed between the first and the second scan lines. Hence, when the open inspection is performed, the sensing current is not transmitted by the other scan line that is not inspected, and as a result, the abnormal test signal would not be generated. As such, according to the active device array substrate and the method for fabricating the same, disconnection defects can be detected, and the open inspection successful rate can be significantly increased.

2. After the open inspection is performed, the first scan lines and the second scan lines are electrically connected through the connectors of the second patterned metal layer or the connectors of the third patterned metal layer, so as to form the electric loop. Hence, the method of the present invention is rather simple and compatible with the existing manufacturing process. Further, costs are not increased by applying the method of the present invention.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. An active device array substrate comprising:
   a substrate;
   a first patterned conductive layer disposed on the substrate, the first patterned conductive layer comprising a plurality of scan line patterns separated from one another, each of the scan line patterns comprising:
      a first scan line having a first contact and a second contact; and
      a second scan line having a first contact and a second contact;
   a plurality of channel layers disposed on the substrate;
   a second patterned conductive layer disposed on the substrate, the second patterned conductive layer comprising:
      a plurality of data lines interlaced with the first scan lines and the second scan lines;
      a plurality of sources and drains, located above the channel layers, the sources being electrically connected to the data lines correspondingly; and
      a plurality of connectors, wherein at least one of the connectors electrically connects the first scan line and the second scan line in each of the scan line patterns, so as to form a loop; and
   a plurality of pixel electrodes connected to the drains.

2. The active device array substrate as claimed in claim 1, wherein the channel layers are formed above or below the scan line patterns.

3. The active device array substrate as claimed in claim 1, further comprising an insulating layer covering the first patterned conductive layer, the insulating layer having a plurality of contacts, each of the connectors connecting the first contact of a corresponding one of the second scan lines and the first contact of a corresponding one of the first scan lines through a corresponding one of the contacts.

4. The active device array substrate as claimed in claim 1, the first patterned conductive layer further comprising at least one common electrode pattern, the at least one common electrode pattern being not connected to the scan line patterns.

5. An active device array substrate comprising:
   a substrate;
   a first patterned conductive layer disposed on the substrate, the first patterned conductive layer comprising a plurality of scan line patterns separated from one another, each of the scan line patterns comprising:
      a first scan line having a first contact and a second contact; and
      a second scan line having a first contact and a second contact;
   a plurality of channel layers and a second patterned conductive layer, disposed on the substrate, the second patterned conductive layer comprising a plurality of data lines interlaced with the first scan lines and the second scan lines, a plurality of sources connected to the first scan lines and the second scan lines, a plurality of drains, and a plurality of first connectors; and
   a third patterned conductive layer comprising a plurality of pixel electrodes connected to the drains and a plurality of second connectors, wherein the first connectors and the second connectors connect the first contacts of the second scan lines and the first contacts of the corresponding first scan lines.

6. The active device array substrate as claimed in claim 5, wherein the first contacts of the first scan lines are not connected to the first contacts of the second scan lines, while the second contacts of the first scan lines are connected to the second contacts of the second scan lines.

7. The active device array substrate as claimed in claim 6, wherein the channel layers are formed above or below the scan line patterns.

8. The active device array substrate as claimed in claim 6, further comprising:
   a passivation layer covering the second patterned conductive layer and having a plurality of first contacts; and
   an insulating layer covering the first patterned conductive layer and having a plurality of second contacts, each of the first connectors having a plurality of openings, the first contacts being located above the openings, the second contacts being located below the openings, wherein in each of the scan line patterns, each of the second connectors electrically connects the first contact of the first scan line and the first contact of the second scan lines through a corresponding one of the openings, a corresponding one of the first contacts, and a corresponding one of the second contacts.

9. The active device array substrate as claimed in claim 6, further comprising:
   a passivation layer covering the second patterned conductive layer and having a plurality of first contacts; and
   an insulating layer covering the first patterned conductive layer and having a plurality of second contacts, each of the first connectors having a plurality of openings, parts of the first contacts being located above the openings, the other parts of the first contacts being located in areas not above the openings, the other parts of the first contacts exposing the first connectors, the second contacts being located below the openings, wherein each of the second connectors electrically connects the first contact of a corresponding one of the first scan lines and the first contact of a corresponding one of the second scan lines through a corresponding one of the openings, a corresponding one of the first contacts, and a corresponding one of the second contacts.

10. The active device array substrate as claimed in claim 5, wherein the first contacts of the first scan lines are not connected to the first contacts of the second scan lines, and the second contacts of the first scan lines are not connected to the second contacts of the second scan lines, wherein the channel layers are formed above or below the scan line patterns, and wherein the first patterned conductive layer further comprises at least one common electrode pattern, the at least one common electrode pattern being not connected to the scan line patterns.

* * * * *